United States Patent
Kimura

(10) Patent No.: US 7,970,194 B2
(45) Date of Patent: Jun. 28, 2011

(54) IMAGE PROCESSING APPARATUS, MAGNETIC RESONANCE IMAGING APPARATUS AND IMAGE PROCESSING METHOD

(75) Inventor: Tokunori Kimura, Yaita (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 1015 days.

(21) Appl. No.: 11/798,830

(22) Filed: May 17, 2007

(65) Prior Publication Data

US 2008/0069417 A1 Mar. 20, 2008

(30) Foreign Application Priority Data

May 26, 2006 (JP) .................................. 2006-146652
Mar. 30, 2007 (JP) .................................. 2007-092642

(51) Int. Cl.
*G06K 9/00* (2006.01)
*G01V 3/00* (2006.01)
*A61B 5/05* (2006.01)

(52) U.S. Cl. ......... 382/131; 382/128; 324/309; 600/410

(58) Field of Classification Search .................. 382/131, 382/128, 100; 324/309, 307, 318, 306, 310; 600/410, 407, 300; 424/9.3
See application file for complete search history.

(56) References Cited

U.S. PATENT DOCUMENTS

| | | |
|---|---|---|
| 5,406,947 A | 4/1995 | Kimura |
| 5,587,656 A | 12/1996 | Van Heels-Bergen et al. |
| 6,845,342 B1 | 1/2005 | Basser et al. |
| 7,260,249 B2 * | 8/2007 | Smith ............................ 382/128 |
| 2004/0064037 A1 | 4/2004 | Smith |

FOREIGN PATENT DOCUMENTS

JP 9-511 1/1997

OTHER PUBLICATIONS

Jones et al., "Isotropic Resolution Diffusion Tensor Imaging With Whole Brain Acquisition in a clinically Acceptable Time," Human Brain Mapping, vol. 15, p. 216-230, 2002, XP002453039.*
Takahara et al; "Diffusion Weighted Whole Body Imaging with Background Body Signal Suppression (DWIBS): Technical Improvement Using Free Breathing, STIR and High Resolution 3D Display", Radiation Medicine: vol. 22, No. 4, pp. 275-282, 2004.
U.S. Appl. No. 11/212,571, filed Aug. 2005, Kimura.
EPO Search Report for counterpart app. EP 07 01 0270 dated Oct. 16, 2007.
Ballon, D. et al., "Imaging Therapeutic Response in Human Bone Marrow Using Rapid Whole Body MRI," Magnetic Resonance in Medicine, vol. 52, 2004, p. 1234-1238, XP002453030.

(Continued)

*Primary Examiner* — Sheela C Chawan
(74) *Attorney, Agent, or Firm* — Nixon & Vanderhye PC

(57) ABSTRACT

An image processing apparatus includes a storage unit, a specifying unit, a calculation unit and a display unit. The storage unit stores diffusion weighted image data. The specifying unit specifies a calculation target region on the diffusion weighted image data. The calculation unit calculates at least one of a diffusion coefficient and a fractional anisotropy serving an index of diffusion anisotropy with regard to the calculation target region based on the diffusion weighted image data. The display unit displays at least one of the diffusion coefficient and the fractional anisotropy calculated by the calculation unit.

11 Claims, 11 Drawing Sheets

OTHER PUBLICATIONS

Krishnamurthy et al., "Automated segmentation of liver metastases in diffusion-weighted echoplanar images using region growing and snakes based on fuzzy sobel edge detector," Proc. Intl. Soc. Mag. Reson. Med. 11, 2004, p. 2213, XP002453031.

Latour et al., "FLAIR-Prepared DWI to Reduce the Effect of Partial Volume Averaging on ADC Maps of Cerebral Ischemia in Humans," Proc. Intl. Soc. Mag. Reson. Med., 1999, p. 1776, XP002453032.

Koennecke et al., "Scattered Infarct Pattern on Diffusion-Weighted Magnetic Resonance Imaging in Acute Ischemic Stroke," Proc. Intl. Soc. Mag. Reson. Med. 8, 2000, p. 1211, XP002453033.

Werring et al., "The structural properties of multiple sclerosis (MS) lesions demonstrated by diffusion tensor imaging," Proc. Intl. Soc. Mag. Reson. Med., 1998, p. 119, XP0023453034.

Grimaud et al., "Quantification of MRI Lesion Load in Multiple Sclerosis: A comparison of three computer-assisted techniques," Magnetic Resonance Imaging, vol. 14, p. 495-505, 1996, XP002453035.

Rangayyan, R.M., "Biomedical Image Analysis," Chap. 5, "Detection of Regions of Interest," p. 363-365, CRC Press LLC, 2005, XP002453042.

Desbarats et al., "Differential MRI diagnosis between brain abscesses and necrotic or cystic brain tumors using the apparent diffusion coefficient and normalized diffusion-weighted images," Magnetic Resonance Imaging, vol. 21, pp. 645-650, 2003, XP002453036.

Kobayashi et al., "Clinical efficacy of a newly developed free-breathing and high b-value MR diffusion weighted imaging method for the assessment of malignancy of the trunk," Proc. Intl. Soc. Mag. Reson. Med. 13, p. 2071, 2005, XP002453037.

Martel et al., "Measurement of Infarct Volume in Stroke Patients Using Adaptive Segmentation of Diffusion Weighted MR Images," Medical Image Computing and Computer-Assisted Intervention—Miccai'99 Lecture Notes in Computer Science; LNCS, Springer-Verlag Berlin Heidelberg, BE, vol. 1679, p. 22-31, 1999, XP019036172, ISBN: 978-3-540-66503-8.

Kono et al., "The Role of Diffusion-weighted Imaging in Patients with Brain Tumors," AJNR Am. J. Neuroradiol, vol. 22, p. 1081-1088, 2001, X0P002453038.

Jones et al., "Isotropic Resolution Diffusion Tensor Imaging With Whole Brain Acquisition in a clinically Acceptable Time," Human Brain Mapping, vol. 15, p. 216-230, 2002, XP002453039.

Iannucci et al., Correlations between Measures of Multiple Sclerosis Pathology Derived from T2, T1, Magnetization Transfer and Diffusion Tensor MR Imaging, Proc. Intl. Soc. Mag. Reson. Med. 9, p. 1411, 2001, XP002453040.

\* cited by examiner b=0 b=1000

ADC

IMAGE PROCESSING APPARATUS, MAGNETIC RESONANCE IMAGING APPARATUS AND IMAGE PROCESSING METHOD

BACKGROUND OF THE INVENTION

1. Field of the Invention

The present invention relates to an image processing apparatus, a magnetic resonance imaging apparatus and an image processing method which produce projected image data and parameter image data from three-dimensional volume data acquired for diagnosis in the medical field.

2. Description of the Related Art

MRI (Magnetic resonance imaging) is one image diagnostic method in the medical field. Magnetic resonance imaging is an imaging method which magnetically excites nuclear spins of an object set in a static magnetic field with an RF (radio frequency) signal having the Larmor frequency and reconstructs an image based on an NMR (nuclear magnetic resonance) signal generated due to the excitation.

Diffusion imaging is an imaging technique based on MRI. Diffusion imaging obtains a DWI (diffusion weighted image) emphasizing diffusion effects by which particles like water molecules spread by Brownian motion due to heat. This diffusion imaging attracts attention for its usefulness in early diagnosis of cerebral infarction. Further, diffusion imaging is developing as DTI (Diffusion tensor imaging) of a cerebral nerve field like detection of aeolotropic properties of a nerve fiber or imaging a nerve fiber with using aeolotropic features. In recent years, applicable scope of MRI has been spreading for the whole body area like an application for screening of cancer.

In diffusion imaging, a pulse sequence having an MPG (Motion Probing Gradient) pulse emphasizing attenuation of MR signals by diffusion can be used. The signal intensity S under diffusion can be represented by expression (1).

Note that, on expression (1), $b[s/mm^2]$ denotes a gradient magnetic field factor representing a degree of signal attenuation due to diffusion, ADC (Apparent Diffusion Coefficient) denotes a degree of diffusion, $S_0$ denotes signal intensity when the gradient magnetic field factor b=0.

As a simple method for general clinical applications of diffusion imaging, diagnosis is often performed using only one pair of images of DWI imaged with an MPG pulse in one direction and under about b=1000 and a base image with b=0. Further, because it is normal to set TE (echo time)>60 ms, a base image with b=0 becomes a T2W (T2 weighted image) having contrast emphasizing a difference of transverse relaxation time (T2).

However, a DWI is an image obtained by changing contrast of a base image (with b=0) due to diffusion. Accordingly, not only a component which was changed due to diffusion, a component which was changed due to T1 (longitudinal relaxation time) or T2 becomes mixed in DWI. On the other hand, in a T2W corresponding to b=0, it is often the case that a pathic tissue shows a higher signal intensity than surrounding normal tissue. In this case, in a DWI, its known phenomenon that pathic tissue continues to show higher signal intensity than surrounding normal tissue even if signal intensity declines due to diffusion, so-called T2 shine through occurs.

Further, in the case of applying an MPG pulse in one direction, a DWI becomes an image having contrast which is dependent on directions of a nerve fiber and an MPG pulse application. That is to say, the more a direction of an MPG pulse application and a traveling direction of a nerve fiber are mutually parallel, signal intensity declines due to diffusion.

Accordingly, what is troubling is a doctor's erroneous reading resulted from MPG direction dependency of contrast due to T2 shine through or DWI.

Therefore, technique is needed which images a DWI to which an MPG is spatially and isotropically changed at least in three directions to cover all and a T2W corresponding to b=0 to obtain an ADC image of only a trace ADC serving as a parameter which is not dependent on a coordinate system. Further, according to need, the aforementioned DTI obtains not only a trace ADC but a quantitative image showing a parameter like FA (Fractional Anisotropy) which is a parameter showing aeolotropy of a nerve fiber by using a T2W corresponding to b=0 and a DWI imaged with changing MPG at least in six directions for diagnosis.

Especially, in the case of screening for a cancer by diffusion imaging, creation of a quantitative image from wide-ranging whole volume data like the entire body is needed (see, for example, Takahara T., Imai Y., Yamashita T., Yasuda S., Nasu S., Van Cauteren M., "Diffusion weighted whole body imaging with background body signal suppression (DWIBS): technical improvement using free breathing, STIR and high resolution 3D display", Radiat Med. 2004 Jul-Aug; 22(4): 275-82).

Normally, since diffusion in a part having possibility of a cancer is small compared to that in a normal tissue (that is to say, ADC is small), a part having possibility of a cancer shows a high signal intensity compared to that in a normal tissue on a DWI. On the other hand, on screening of a cancer in whole body organ, a great deal of volume data can be obtained. Because of this, image data is compressed by performing MIP (Maximum Intensity Projection) processing to a DWI. Then, it's often the case that compressed image information is displayed and supplied for diagnosis.

Further, in the case where diffusion imaging applies to screening of a cancer in the body trunk, because of a small ADC in fat, there is a fear of false diagnosis that a fat is a cancer if a DWI which is obtained by normal processing is supplied for diagnosis. Then, on screening for a cancer in the body trunk, collection of a DWI is held after reducing a fat signal using fat suppression in advance. In the case of using fat suppression, it's considered that probability of existence of a cancer tissue is small on a part showing a low signal intensity on a DWI and the part can be assumed as a normal part since the T2 value is short and ADC is large in normal tissue except fat.

Further, in the case that a doctor interprets an ADC image created from a DWI, the doctor diagnoses a high signal part on the DWI concerned with the ADC image. There is a tendency that contrast of a cancer and a normal part of a DWI becomes larger compared to that of an ADC image. This is because a DWI has a synergy effect of contrast due to T2.

FIG. 11 is a T2W showing pancreatic cancer and liver metastasis which is a clinical example of trunk diffusion obtained by conventional magnetic resonance imaging. FIG. 12 is a DWI of the pancreatic cancer and liver metastasis shown in FIG. 11 obtained by conventional magnetic resonance imaging. FIG. 13 is an ADC image of the pancreatic cancer and liver metastasis shown in FIG. 11 obtained by conventional magnetic resonance imaging.

According to T2W (b=0) of FIG. 11, it can be confirmed that a cancer part showed by an arrowhead shows a bit higher signal compared to a surrounding normal tissue. This shows that a T2 value on a cancer part is large. Further, on a DWI (b=1000) of FIG. 12, it can be confirmed that a cancer part showed by an arrowhead is imaged with a further higher signal than that on the T2W. On the contrary, it can be confirmed that signal of a cancer part showed by an arrowhead shows a low intensity on an ADC image of FIG. 13. Further, to according to FIG. 12 and FIG. 13, it can be understood that a contrast difference of a cancer part and a normal tissue of a DWI is larger compared to that of an ADC image.

FIG. 14 is a graph showing variations of respective signal intensities in a normal tissue and tumor each depending on a value of a gradient magnetic field factor b in diffusion imaging.

In FIG. 14, the abscissa indicates a gradient magnetic field factor b [$s/mm^2$] and the ordinate indicates signal intensity. The solid line in FIG. 14 shows variation of signal intensity corresponding to a value of gradient magnetic field factor b in normal tissue, and the dotted line shows variation of signal intensity corresponding to a value of gradient magnetic field factor b in a tumor.

FIG. 14 shows that the tumor has a property that a signal intensity on b=0 is large compared to that in a normal tissue and also an attenuation along increase of b is small. Accordingly, a difference in respective signal intensities of the tumor and the normal tissue on a DWI corresponding to b=1000 becomes larger than a difference in respective signal intensities of the tumor and normal tissue on a T2W corresponding to b=0. As a result, from this it can be understood that detection sensitivity of cancer in a DWI is higher than that in a T2W.

However, on an ADC image, a part having a possibility of a cancer shows a low signal intensity and contrast difference between the part having a possibility of a cancer and surrounding normal tissue is small compared to that in a DWI. Accordingly, projection processing to a two-dimensional plane like MIP processing or mIP (minimum intensity projection) processing is not present in an ADC image. Accordingly, a doctor can't interpret an ADC image only by slice in spite of creation of the ADC image. Because of this, consequently, an interpretation of an ADC image is more different.

On the other hand, an ROI (region of interest) may be set to a part having a possibility of a cancer detected as high signal part on a DWI and diagnosis using the DWI is performed numerically. However, there is fear that arbitrariness of a doctor affects setting of the ROI. Further, a doctor can know numerical information on a part having a possibility of a cancer only as an average value in the whole ROI. Because of this, there is a problem that oversight of a cancer is easy to occur.

Under the background like this, the present situation is that diagnosis of whole body organ using an ADC image is not generalized compared to diagnosis of brain in spite of its importance being recognized. Because of this, there is a fear that trouble happens to accumulation of evidence on a cancer diagnosis.

Thus, a problem like this has commonality to a diagnosis image imaged not only by MRI but by various image diagnostic apparatuses. That is to say, a consequence of need to interpret extravagant image information by a doctor, is a fear that trouble occurs to not only diagnosis efficiency and diagnosis effects but also to adoption of the diagnosis method itself. Examples include the case which obtains not only a DWI but a quantitative value of a different type of parameter like ADC or FA on diffusion imaging of entire body of MRI dealing with a large amount of volume data like above-mentioned. Further, there is a problem that generation of extravagant image information causes increased information processing.

SUMMARY

The present exemplary embodiment has been made in light of the conventional situations, and it is an object of the present invention to provide an image processing apparatus, a magnetic resonance imaging apparatus and an image processing method which make it possible to reduce interpretation load of a doctor to improve diagnostic efficiency and diagnostic effect by selecting or compressing image information for diagnosis, such as ADC and FA.

Furthermore, another object of the present invention is to provide an image processing apparatus, a magnetic resonance imaging apparatus and an image processing method which make it possible to supply image information such as ADC and FA for diagnosis with less data processing amount.

The present invention provides an image processing apparatus comprising: a storage unit configured to store diffusion weighted image data; a specifying unit configured to specify a calculation target region on the diffusion weighted image data; a calculation unit configured to calculate at least one of a diffusion coefficient and a fractional anisotropy serving an index of diffusion anisotropy with regard to the calculation target region based on the diffusion weighted image data; and a display unit configured to display at least one of the diffusion coefficient and the fractional anisotropy calculated by said calculation unit, in an aspect to achieve an object.

The present invention also provides a magnetic resonance imaging apparatus comprising: a data acquisition unit configured to acquire diffusion weighted image data; a specifying unit configured to specify a calculation target region on the diffusion weighted image data; a calculation unit configured to calculate at least one of a diffusion coefficient and a fractional anisotropy serving an index of diffusion anisotropy with regard to the calculation target region based on the diffusion weighted image data; and a display unit configured to display at least one of the diffusion coefficient and the fractional anisotropy calculated by said calculation unit, in an aspect to achieve an object.

The present invention also provides an image processing method comprising steps of: specifying a calculation target region on diffusion weighted image data; calculating at least one of a diffusion coefficient and a fractional anisotropy serving an index of diffusion anisotropy with regard to the calculation target region based on the diffusion weighted image data; and displaying at least calculated one of the diffusion coefficient and the fractional anisotropy, in an aspect to achieve an object.

The image processing apparatus, the magnetic resonance imaging apparatus and the image processing method according to the invention as described above make it possible to reduce interpretation load of a doctor to improve diagnostic efficiency and diagnostic effect by selecting or compressing image information for diagnosis, such as ADC and FA.

Furthermore, the image processing apparatus, the magnetic resonance imaging apparatus and the image processing method according to the invention make it possible to supply image information such as ADC and FA for diagnosis with less data processing amount.

DESCRIPTION OF THE PREFERRED EMBODIMENTS

An image processing apparatus, a magnetic resonance imaging apparatus and an image processing method according to embodiments of the present invention will be described with reference to the accompanying drawings.

1. First Embodiment 1-1. Constitution and Function

Figure 1:
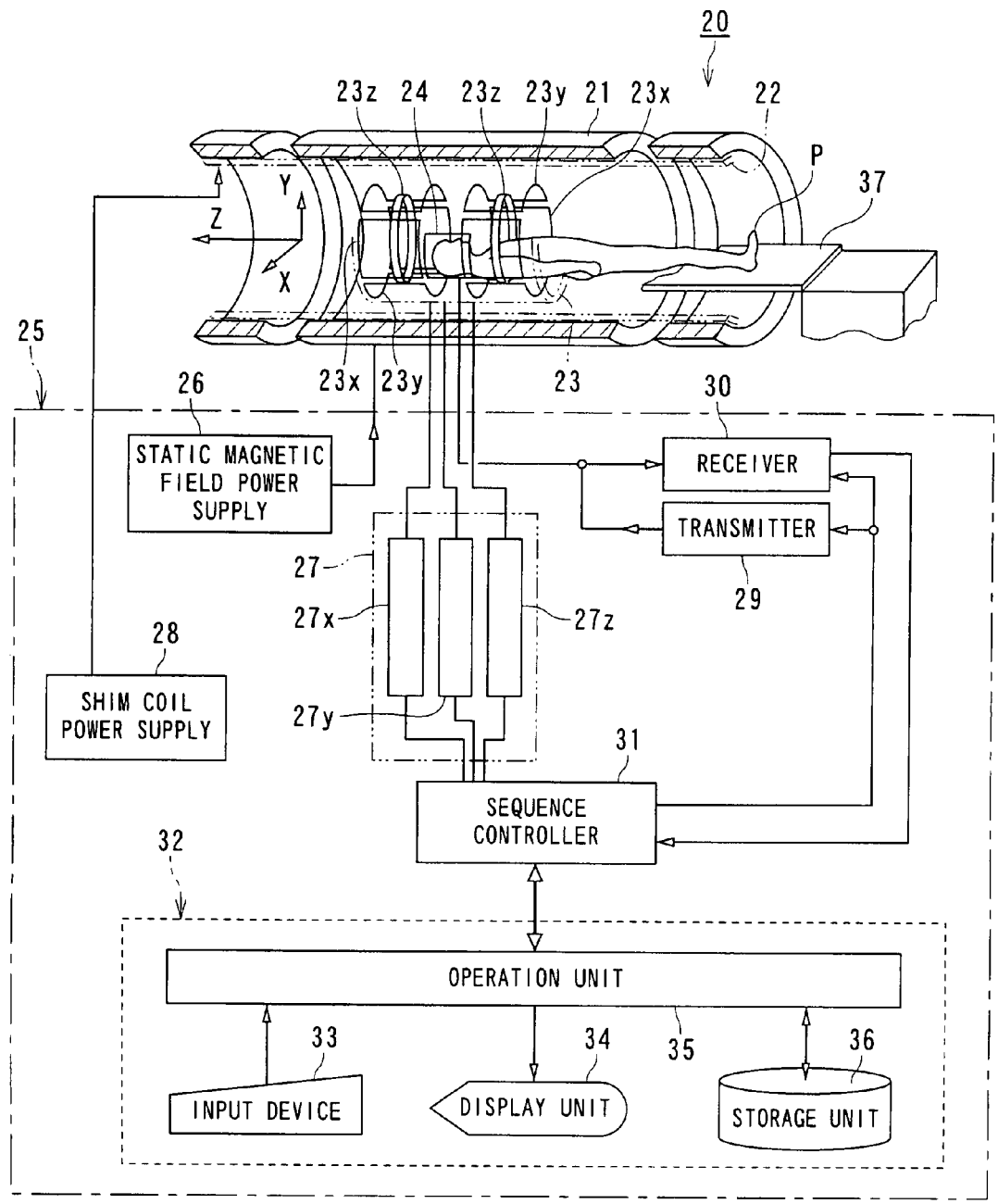
FIG. 1 is a block diagram showing a magnetic resonance imaging apparatus according to a first embodiment of the present invention.

FIG. 1 is a block diagram showing a magnetic resonance imaging apparatus according to a first embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and a RF coil 24. The static field magnet 21, the shim coil 22, the gradient coil 23 and the RF coil 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a monitor 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. Around the bed 37 or the object P, the RF coil 24 may be arranged instead of being built in the gantry.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coil 24 communicates with the transmitter 29 and the receiver 30. The RF coil 24 has a function to transmit a RF signal given from the transmitter 29 to the object P and receive an NMR signal generated due to a nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27

The sequence controller 31 is also configured to give raw data to the computer 32. The raw data is complex number data obtained through the detection of a NMR signal and A/D conversion to the NMR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a NMR signal given from the RF coil 24 and performing predetermined signal processing and A/D converting to the NMR signal detected. The receiver 30 also has a function to give the generated raw data to the sequence controller 31.

The computer 32 gets various functions by the operation unit 35 executing some programs stored in the storage unit 36 of the computer 32. The computer 32 may include some specific circuits instead of using some of the programs.

Figure 2:
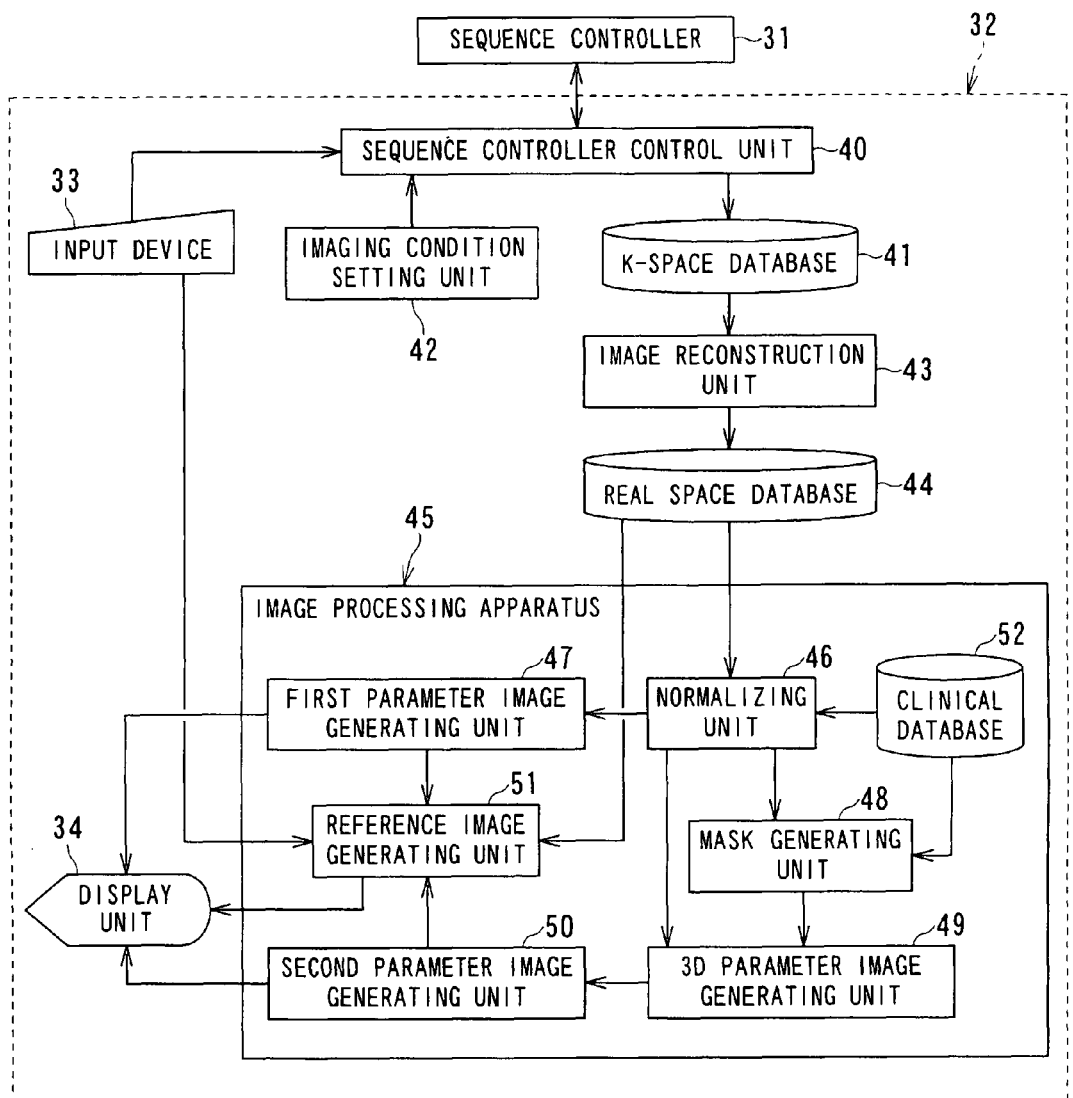
FIG. 2 is a functional block diagram of the computer 32 in the magnetic resonance imaging apparatus 20 shown in FIG. 1.

FIG. 2 is a functional block diagram of the computer 32 in the magnetic resonance imaging apparatus 20 shown in FIG. 1.

The computer 32 functions as a sequence controller control unit 40, a k-space database 41, an imaging condition setting unit 42, an image reconstruction unit 43, a real space database 44 and an image processing apparatus 45. The image processing apparatus 45 includes a normalizing unit 46, a first parameter image generating unit 47, a mask generating unit 48, a 3D parameter image generating unit 49, a second parameter image generating unit 50, a reference image generating unit 51 and a clinical database 52.

The sequence controller control unit 40 has a function for controlling the driving of the sequence controller 31 by giving a pulse sequence to the sequence controller 31 based on information from the input device 33 or another element. In particular, the sequence controller control unit 40 is configured to give an arbitrary sequence to the sequence controller 31 to acquire an image like a T2W and also gives a DWI sequence with application of an MPG pulse to the sequence controller 31 to execute diffusion imaging.

Further, the sequence controller control unit 40 has a function for receiving raw data serving as k-space data from the sequence controller 31 and arranging the raw data to k space (Fourier space) formed in the k-space database 41. Therefore, the k-space database 41 stores the raw data generated by the receiver 30 as k-space data.

The imaging condition setting unit 42 has a function to generate a pulse sequence such as a DWI sequence as an imaging condition and give the generated pulse sequence to the sequence controller control unit 40.

The image reconstruction unit 43 has a function for capturing the k-space data from the k-space database 41, performing image reconstruction processing, such as Fourier transform processing, to the k-space data to generate three dimensional image data in the real space as volume data, and writing the generated volume data into the real space database 44. Therefore, the volume data generated by the image reconstruction unit 43, i.e. the volume data acquired by a scan, is stored in the real space database 44. Note that, volume data corresponding to a gradient magnetic field factor b>0 which was obtained by diffusion imaging becomes DWI volume data, and volume data obtained under a gradient magnetic field factor b=0 becomes T2W volume data when a TE>about 80 ms. Hereinafter, description will be given by assuming that base volume data corresponding to a gradient magnetic field factor b=0 is T2W volume data.

A value of the gradient magnetic field factor b can be controlled by adjusting an intensity and an application period of an MPG pulse in a DWI sequence.

Figure 3:
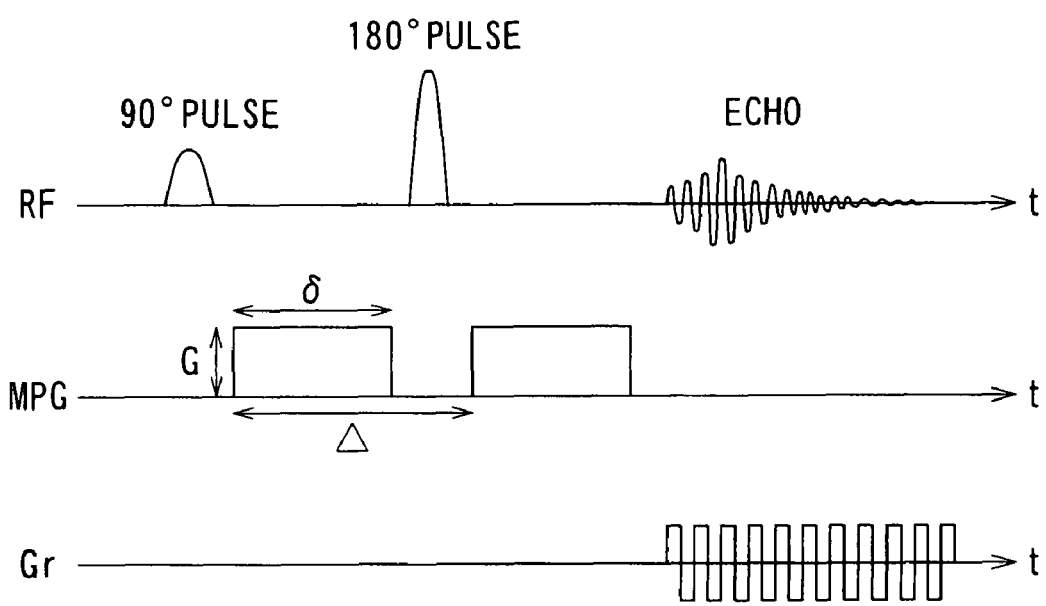
FIG. 3 is a diagram showing a DWI sequence used in the magnetic resonance imaging apparatus 20 shown in FIG. 1.

FIG. 3 is a diagram showing a DWI sequence used in the magnetic resonance imaging apparatus 20 shown in FIG. 1.

In FIG. 3, RF denotes RF signals transmitted from the RF coil 24 to an object P and an echo signal from the object P, MPG denotes MPG pulses and Gr denotes gradient magnetic field pulses for readout. FIG. 3 shows a DWI sequence under EPI (echo planar imaging). Specifically, a 180° pulse is applied after a 90° pulse application. In addition, MPG pulses are applied before and after the 180° pulse respectively after the 90° pulse application. Further, gradient magnetic field pulses for readout are applied after the application of MPG pulses. Thus, an echo signal is acquired from the object P.

The intensity G, the application period δ and the period from start of the first MPG pulse application to start of the next MPG pulse application Δ of the MPG pulses shown in FIG. 3 are respectively determined according to a targeted value of the gradient magnetic field factor b as expression (2).

$$b = \int_0^{TE} \left\{ \int_0^\tau G(t)\,dt \right\}^2 d\tau = \gamma^2 G^2 \delta^2 (\Delta - \delta/3) \qquad (2)$$

A larger gradient magnetic field factor b allows a smaller diffusion to be imaged as a shift of phase. A value of the gradient magnetic field factor b is set to one about from 50 [s/mm$^2$] to 2000 [s/mm$^2$] at the most. For example, a value of the gradient magnetic field factor b is set to one from 500 [s/mm$^2$] to 2000 [s/mm$^2$] in case of detecting a cancer in an abdomen.

It is understand that an intensity G of an MPG pulse should be set to be large, an application period δ of an MPG pulse should be set to be long or a period Δ from start of the first MPG pulse application to start of the next MPG pulse application should be set to be long in order to enlarge the value of the gradient magnetic field factor b from the expression (2).

The image processing apparatus 45 has function to generate at least two types of quantitative parameter images having mutually different parameters based on volume data stored in the real space database 44 serving as original data for diagnosis. For example, the image processing apparatus 45 is configured to generate a projected DWI which is obtained by two-dimensionally projecting a DWI, a projected ADC image which is obtained by two-dimensionally projecting an ADC image and a projected FA image which is obtained by two-dimensionally projecting a FA image from DWI volume data.

The pieces of DWI volume data used for generating a projected ADC image and a projected FA image are not always the same type. For example, some types of pieces of DWI volume data corresponding to mutually different values of the gradient magnetic field factor b respectively or some types of pieces of DWI volume data obtained with MPG pulse applications in mutually different directions may be recorded in the real space database 44 and the image processing apparatus 45 may generate a projected ADC image and/or a projected FA image from some types of pieces of DWI volume data.

Note that, a projected ADC image which is not dependent on a direction can be supplied for diagnosis when a trace ADC image which is not dependent on a coordinate system is obtained as an ADC image for generating a projected ADC image from a DWI acquired with changing an MPG in directions more than three direction. A detail description of a trace ADC and a FA obtained with MPG in 6 axis directions is given in P. J. Bassier et al. "A simplified method to measure the diffusion tensor from MR images." Magn. Reson. Med. 39; 928-934 (1998).

However, when a projected ADC image and a projected FA image are generated by using all DWI volume data, an amount of information becomes large. Therefore, the image processing apparatus 45 has a function to generate a projected ADC image and a projected FA image with using only information useful for diagnosis selectively.

To be more precise, a normal tissue and air show a low signal intensity while a portion having possibility of a cancer shows a high signal intensity on a DWI. Thereupon, a threshold to signal intensity is set to extract a portion having possibility of a cancer selectively on a DWI, and then a area exceeding the threshold is set as a calculation target for a projected ADC image and a projected FA image which are quantitative images. That is to say, the image processing apparatus 45 has a function to generate a mask to determine a portion having possibility of a cancer which is to be a calculation target area for a projected ADC image and a projected FA image of DWI volume data. Note that, the calculation target region can be set to be not only a diagnostic region self such as a portion having possibility of cancer but a region formed by adding a margin region to a diagnostic region.

For that purpose, elements of the image processing apparatus 45 have functions to perform above-mentioned processing.

The normalizing unit 46 has function to normalize DWI volume data and T2W volume data read from the real space database 44 and give the DWI volume data after normalization to the first parameter image generating unit 47, the mask generating unit 48 and the 3D parameter image generating unit 49, and the T2W volume data after normalization to the 3D parameter image generating unit 49 respectively. Normally, an intensity of signal acquired on an MRI changes every examination according to various kind of examination conditions like a magnetic field intensity, an RF coil 24, a size of an object P, a type of a pulse sequence. Thereupon, a difference of signal intensities by examination can be reduced by normalizing image values of DWI volume data and T2W volume data. Further, the normalizing unit 46 is configured to acquire data necessary for normalization from the clinical database 52.

The first parameter image generating unit 47 has function to perform two-dimensional projection by subjecting the DWI volume data after normalization received from the normalizing unit 46 to MIP processing. Further, the first parameter image generating unit 47 has function to display a projected DWI image which was generated by two-dimensional projection to the DWI volume data on display unit 34. Further, the first parameter image generating unit 47 has function to store correspondence information between positions on the DWI volume data and data positions on the projected DWI image as needed.

The mask generating unit 48 has function to generate a mask to determine a calculation target of the projected ADC image and the projected FA image by judging whether signal intensities of the DWI volume data after normalization received from the normalizing unit 46 are within a range decided with a predetermined threshold and has function to give the generated mask to 3D parameter image generating unit 49. Further, the mask generating unit 48 is configured to acquire a threshold or information to determine a threshold need for generating the mask from the clinical database 52.

Note that, when determination of a calculation target for a projected ADC image and a projected FA image is performed with using a mask which was generated by only threshold processing, unnecessary things except a disease part may be extracted as a calculation target of a projected ADC image and a projected FA image by influence by noise, or on the contrary, a part in a disease part may not be extracted as a calculation target of a projected ADC image and a projected FA image. To prevent that, a mask may be generated with adding processing to perform reduction of isolated points by scaling processing after threshold processing. That is, scaling processing to the mask may be performed so that a margin region be included in the calculation target region of the projected ADC image and/or the projected FA image. Alternatively or additionally, a margin may be set to the threshold self.

The 3D parameter image generating unit 49 has function to perform mask processing to DWI volume data and T2W volume data received from the normalizing unit 46 with using the receiver from the mask generating unit 48, and has function to calculate a three-dimensional ADC image and a three-dimensional FA image with using the DWI volume data and the T2W volume data after mask processing. Further, the 3D parameter image generating unit 49 is configured to give the ADC image obtained by calculation to the second parameter image generating unit 50.

The second parameter image generating unit 50 has function to generate a projected ADC image and a projected FA image by performing two-dimensional projection processing such as mIP processing and average projection processing to the ADC image and the FA image acquired from the 3D parameter image generating unit 49, and has function to display the projected ADC image and the projected FA image which were generated on the display unit 34. Further, the second parameter image generating unit 50 has function to store correspondence information between each position of data on a projected ADC image and a projected FA image and the corresponding position on an ADC image and a FA image which is volume data as needed.

The reference image generating unit 51 has function to read necessary data from the real space database 44 to generate another desired reference image on which marking is performed on a position corresponding to marking on a projected DWI image generated by the first parameter image generating unit 47 or a projected ADC image and/or a projected FA image generated by the second parameter image generating unit 50 when display instruction of a reference image is received from the input device 33. The reference image generating unit 51 also has function to display the generated reference image on the display unit 34. Further, the reference image generating unit 51 is configured to be able to refer positional correspondence information between a volume image and a projected image stored in the first parameter image generating unit 47 or the second parameter image generating unit 50 to obtain a position for marking on a reference image.

In addition, the reference image generating unit 51 has function to display a projected DWI image generated by the first parameter image generating unit 47, a projected ADC image and/or a projected FA image generated by the second parameter image generating unit 50 with overlaying a desired image, as needed.

The clinical database 52 stores information such as data necessary for normalization processing by the normalizing unit 46 and a threshold or a parameter and clinical data to determine a threshold necessary for generating a mask by the mask generating unit 48.

1.-2 Operation and Action

Next, the operation and action of a magnetic resonance imaging apparatus 20 will be described.

First, T2W volume data of an object P is acquired by performing imaging scan. Further, DWI volume data of the object P is acquired by diffusion imaging. More specifically, the object P is set on the bed 37 in advance, and a static magnetic field is formed on an imaging area in the static field magnet 21 (super conductive magnet) excited by static the magnetic field power supply 26. Further, the static magnetic field formed on the imaging area is uniformized by supplying electric current from the shim coil power supply 28 to the shim coil 22.

When acquisition indication of a T2W and a DWI on a diagnosis part of the object P is given from the input device 33 to the sequence controller control unit 40, the sequence controller control unit 40 acquires a DWI sequence with applying an MPG pulse for acquiring a DWI from the imaging condition setting unit 42, and acquires an arbitrary pulse sequence for acquiring a T2W to give to the sequence controller 31. The sequence controller 31 forms gradient magnetic fields on the imaging area in which the object P is set and generates an RF signal from the RF coil 24 by driving the gradient power supply 27, the transmitter 29 and the receiver 30 according to the pulse sequence given from the sequence controller control unit 40.

Consequently, an NMR signal occurred by nuclear magnetic resonance in the object P is received by the RF coil 24 to give to the receiver 30. The receiver 30 receives the NMR signal from the RF coil 24 and generates raw data which is a digital NMR signal by A/D conversion after executing required signal processing. The receiver 30 gives the generated raw data to the sequence controller 31. The sequence controller 31 gives the raw data to the sequence controller control unit 40, and the sequence controller control unit 40 arranges the raw data as k-space data in k-space formed in the k-space database 41.

Next, the image reconstruction unit 43 captures k-space data from the k-space database 41 and generates three-dimensional image data in the real space as volume data by performing image reconstruction processing including Fourier transform processing. The generated volume data is written in the real space database 44 from the image reconstruction unit 43 to be stored. As a result, DWI volume data acquired by performing a DWI sequence and T2W volume data acquired by performing a pulse sequence for T2W acquisition are stored in the real space database 44.

Then, a projected DWI image, a projected ADC image and a projected FA image is generated from the DWI volume data and the T2W volume data stored in the real space database 44 by the image processing apparatus 45 to be displayed on the display unit 34. Further, an image for reference is generated by the image processing apparatus 45 to be displayed on the display unit 34, as needed.

Figure 4:
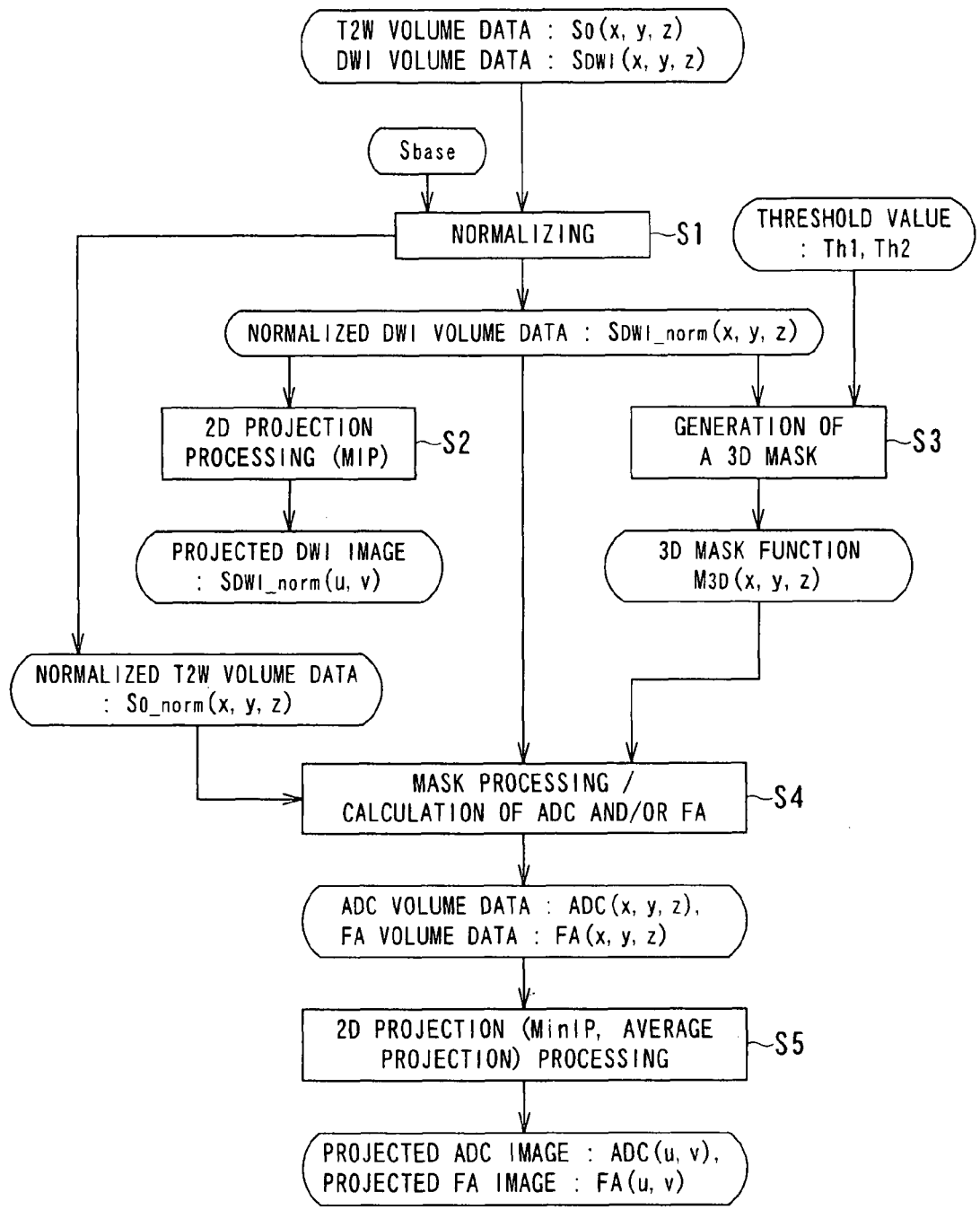
FIG. 4 is a flowchart showing a flow of image processing in the image processing apparatus shown in FIG. 2.

FIG. 4 is a flowchart showing a flow of image processing in the image processing apparatus 45 shown in FIG. 2. The symbols each including S with a number in FIG. 4 indicate steps of the flowchart.

First, on step S1, normalization of the T2W volume data and the DWI volume data is performing by the normalizing unit 46. More specifically, the normalizing unit 46 reads the T2W volume data and the DWI volume data from the real space database 44 and performs normalization of the T2W volume data and the DWI volume data by expression (3-1) and expression (3-2) respectively.

$$S_{0\_norm}(x,y,z)=S_0(x,y,z)/S_{0\_base} \quad (3\text{-}1)$$

$$S_{DWI\_norm}(x,y,z)=S_{DWI}(x,y,z)/S_{0\_base} \quad (3\text{-}2)$$

wherein $S_{0\_norm}(x,y,z)$: a signal intensity of a voxel at a position $(x,y,z)$ after normalization of the T2W volume data, $S_{DWI\_norm}(x,y,z)$ a signal intensity of a voxel at a position $(x,y,z)$ after normalization of the DWI volume data, $S_0(x,y,z)$: a signal intensity of a voxel at a position $(x,y,z)$ before normalization of the T2W volume data, $S_{DWI}(x,y,z)$: a signal intensity of a voxel at a position $(x,y,z)$ before normalization of the DWI volume data, and $S_{0\_base}$: a signal intensity at a specific portion of the T2W volume data measured for normalization.

Note that, $S_{0\_base}$ is measured on a region, such as fat or a spleen, in which its value difference between different objects P is small comparatively and stored in the clinical database 52 in advance. The normalizing unit 46 performs normalization of the T2W volume data and the DWI volume data with using $S_{0\_base}$ stored in the clinical database 52. Then, the normalizing unit 46 gives the DWI volume data after the normalization to the first parameter image generating unit 47, the mask generating unit 48 and the 3D parameter image generating unit 49, and gives the T2W volume data after the normalization to the 3D parameter image generating unit 49 respectively.

Next, on step S2, a projected DWI image is generated by the first parameter image generating unit 47 to be displayed on the display unit 34. More specifically, the first parameter image generating unit 47 generates a projected DWI image by performing MIP processing to the DWI volume data after the normalization received from the normalizing unit 46 as shown in expression (4).

$$\text{MIP}[S_{DWI\_norm}(x,y,z)] \quad (4)$$

wherein MIP[ ] denotes MIP processing.

Further, in the case of displaying an after-mentioned reference image, the first parameter image generating unit 47 stores correspondence information of data positions between the projected DWI image and the DWI volume data after the normalization. Then, the first parameter image generating unit 47 gives the generated projected DWI image to display unit 34 to be displayed on it.

On the other hand, on step S3, the mask generating unit 48 generates a mask to determine a calculation target of the projected ADC image and the projected FA image. More specifically, the mask generating unit 48 generates a mask function by comparing signal intensities of the DWI volume data after the normalization received from the normalizing unit 46 with a predetermined threshold. An algorithm for generating a mask function is like as expression (5) for example.

$$\begin{aligned}&\text{Do for all voxels }(x,y,z) \quad (5)\\&\quad \text{if Th1}<S_{DWI\_norm}(x,y,z)<\text{Th2}\\&\quad\quad M_{3D}(x,y,z)=1\\&\quad \text{else}\\&\quad\quad M_{3D}(x,y,z)=0\\&\quad \text{end}\\&\text{end}\end{aligned}$$

where

Th1: a threshold for a lower limit of a signal intensity of DWI volume data after normalization, Th2: a threshold for an upper limit of a signal intensity of DWI volume data after normalization, and $M_{3D}(x,y,z)$: a three-dimensional mask function.

More specifically, the mask generating unit 48 determines whether a voxel signal intensity on each of all positions $(x,y,z)$ of the DWI volume data on after the normalization is within a range decided by a threshold Th1 for a lower limit and a threshold Th2 for an upper limit or not sequentially. In the case that a signal intensity of voxel is within the range decided by the threshold Th1 for the lower limit and the threshold Th2 for the upper limit, a value of the mask function $M_{3D}(x,y,z)$ on the position $(x,y,z)$ of the voxel is set to 1. Further, a value of the mask function $M_{3D}(x,y,z)$ on each position $(x,y,z)$ of other voxels is set to 0.

That is, the mask function $M(x,y,z)$ is generated from the DWI volume data on after the normalization so that a value of the mask function $M(x,y,z)$ becomes 1 on an area which is a calculation target of the ADC image and the FA image serving as original data for the projected ADC image and the projected FA image and a value of the mask function M (x,y,z) becomes 0 on an area which is not a calculation target of the ADC image and the FA image. Therefore, the threshold Th1 for the lower limit and the threshold Th2 for the upper limit are determined so that an area consisting of air or a normal tissue is excluded from a calculation target of the ADC image and the FA image respectively.

For example, on a DWI image, an area having possibility of a cancer shows a high signal compared to an area consisting of a normal tissue. Accordingly, the threshold Th2 for the upper limit is set to a maximum value which is unable to be shown on a fat tissue or a living body or the like. On the other hand, the threshold Th1 for the lower limit is set to a minimum value which may be shown on a portion having possibility of a cancer and the like to exclude an area consisting of air or a normal tissue. Thus, a range beyond the threshold Th1 for the lower limit is set to a region having possibility of cancer which should be set to the calculation target region.

Specifically, the threshold Th1 for the lower limit and the threshold Th2 for the upper limit can be determined based on past clinical data. That is, a lower limit and an upper limit of a signal intensity showing possibility of a cancer are estimated statistically as an extraction condition of an area having possibility of a cancer based on a signal intensity of a high signal area confirmed as a cancer on a past DWI acquired under a same imaging condition in advance. Accordingly, a normal tissue may be included in an area having possibility of a cancer. It is important in view of preventing a detection error of a cancer that an extraction condition of an area having possibility of a cancer is set to be relaxed so as to make an area which is a calculation target of an ADC image and a FA image larger than a fundamentally necessary area. Accordingly, clinical data to determine the threshold Th1 for the lower limit and the threshold Th2 for the upper limit is not always needed to be strict.

Clinical data to determine the threshold Th1 for the lower limit and the threshold Th2 for the upper limit can be stored in the clinical database 52 so that the mask generating unit 48 can refer the clinical data at generating a mask. Alternatively, the threshold Th1 for the lower limit and the threshold Th2 for the upper limit their selves or parameters to determine the threshold Th1 for the lower limit and the threshold Th2 for the upper limit may be determined in advance and stored in the clinical database 52 so that the mask generating unit 48 can refer the stored data at generating a mask.

For example, like expression (6-1) and expression (6-2), the threshold Th1 for the lower limit and the threshold Th2 for the upper limit can be determined by multiplying a constant proportion to a maximum value of the signal intensities of the DWI volume data after the normalization.

$$Th1 = a1 \cdot \max[S_{DWI\_norm}(x,y,z)] \quad (6\text{-}1)$$

$$(0 \leq a1 \leq 1)$$

$$Th2 = a2 \cdot \max[S_{DWI\_norm}(x,y,z)] \quad (6\text{-}2)$$

$$(0 \leq a2 \leq 1)$$

wherein a1: a rate for determining the threshold Th1 for the lower limit and a2: a rate for determining the threshold Th2 for upper limit.

The proportions a1, a2 shown in expression (6-1) and expression (5-2) can be determined empirically. The determined proportions a1, a2 may be stored in the clinical database 52 so that the mask generating unit 48 can refer the proportions a1, a2 at generating a mask. Further, a larger proportional makes the threshold Th1 for the lower limit larger so that an area having possibility of a cancer is extracted with a less area consisting of a normal tissue. Accordingly, a proportion a1 is determined as a maximum value by which a doctor can have doubt about existing possibility of a cancer, i.e., a value giving consideration that possibility of a cancer is the lowest while the possibility of a cancer exists. Further, since air generally shows only noise, the threshold Th1 for the lower limit is set to be larger than a value corresponding to air. Accordingly, not only an area consisting of a normal tissue but air is excluded by the threshold Th1 for the lower limit.

Further, set of the thresholds Th1, Th2 may be conducted by changing the threshold Th1, Th2 and observing an extracted area on an image to set the threshold Th1,Th2 to appropriate values by a user. This method is efficient in case where data is too inadequate to know thresholds or value fluctuation between apparatuses or conditions is large.

The mask function generated by the mask generating unit 48 is given to the 3D parameter image generating unit 49.

Next, in step S4, the 3D parameter image generating unit 49 performs mask processing to the DWI volume data and the T2W volume data received from the normalizing unit 46 with using the mask function received from the mask generating unit 48, and calculates an ADC image and a FA image with using the DWI volume data and the T2W volume data after the mask processing. When the DWI volume data after normalization is set to be original data, the mask processing is represented as expression (7-1), ADC processing to calculate an ADC image is represented as expression (7-2). Further, FA processing to calculate a FA image is represented as expression (7-3).

$$\text{Mask}[S_{DWI\_norm}(x,y,z)] \quad (7\text{-}1)$$

$$\text{ADC}[\text{Mask}[S_{DWI\_norm}(x,y,z)]] \quad (7\text{-}2)$$

$$\text{FA}[\text{Mask}[S_{DWI\_norm}(x,y,z)]] \quad (7\text{-}3)$$

wherein Mask[ ] denotes mask processing, ADC[ ] denotes ADC processing and FA[ ] denotes FA processing.

Further, an algorithm to execute mask processing, ADC processing and FA processing is represented as expression (8), for example.

$$\begin{aligned}
&\text{Do for all voxels } (x,y,z) \text{ of } M_{3D}(x,y,z)=1 \quad (8)\\
&\quad \text{ADC}(x,y,z) = \ln\{S_{0\_norm}(x,y,z)/S_{DWI\_norm}(x,y,z)\}/(b_n-b_0)\\
&\quad \text{FA}(x,y,z) =\\
&\quad \text{sqrt}(1.5) \cdot \text{sqrt}[(\lambda_1-D_m)^2+(\lambda_2-D_m)^2+(\lambda_3-D_m)^2]/\text{sqrt}(\lambda_1^2+\lambda_2^2+\lambda_3^2)\\
&\text{End}
\end{aligned}$$

wherein

ADC(x,y,z): an image value of the ADC image at a position (x,y,z), $b_n$: a gradient magnetic field factor corresponding to the DWI volume data, $b_0$: a gradient magnetic field factor corresponding to the volume data serving a base for the DWI volume data (generally a gradient magnetic field factor $b_0=0$ corresponding to the T2W volume data), $D_m$: a mean diffusivity $=(\lambda_1+\lambda_2+\lambda_3)/3$, and $\lambda_1, \lambda_2, \lambda_3$ ($\lambda_1 > \lambda_2 > \lambda_3$): characteristic values, which are functions of (x,y,z), of a diffusion Tensor ellipsoid.

Note that, when the ADC (x,y,z) calculated by expression (8) is an isotropic diffusivity calculated in MPG directions including at least orthogonal three directions, the mean diffusivity $D_m$=ADC (x,y,z). Further, MPG axes in at least six directions are needed since calculation of FA (x,y,z) needs to define each element of a 3×3 symmetric matrix representing a diffusion tensor.

The ADC image and the FA image are calculated with regard to only all voxel in the mask area in which a value of the mask function is 1. Note that, the ADC image can be calculated from volume data (normally T2W volume data) acquired under a gradient magnetic field factor $b_0=0$ and at least one DWI volume data acquired under a gradient magnetic field factor $b_n>0$. The algorithm of expression (8) shows an example to calculate the ADC image from one DWI volume data and one T2W volume data. Further, the FA image can be calculated from the ADC image.

Then, the 3D parameter image generating unit 49 gives the ADC image and the FA image obtained by calculation like this to the second parameter image generating unit 50.

Next, in step S5, the second parameter image generating unit 50 generates a projected ADC image and a projected FA image by performing two-dimensional projection processing to the ADC image and the FA image acquired from the 3D parameter image generating unit 49. It is considered that the higher possibility of a cancer makes an image value of the ADC image smaller. Accordingly, a projected ADC image acquired from performing mIP processing to the ADC image with regarding a signal intensity on a air part inside the mask area as the threshold for the lower limit or performing processing to project an average value of voxel values within the range of thresholds of the ADC image in a projection direction is a meaningful image clinically. Further, a projected FA image obtained by performing processing to project an average value of the FA image is a meaningful image clinically. An algorithm in case of performing mIP processing to the ADC image and performing average projection processing to the FA image respectively is represented as expression (9) for example.

---

Do for all (u,v) along corresponding projection    (9)
line of $M_{3D}(x,y,z)=1$
    ADC(u,v)=mIP[ADC(x,y,z)]
    FA(u,v)=AveP[FA(x,y,z)]
End

--- wherein

ADC(u,v): an image value of the projected ADC image at a position (u,v) corresponding to a projection line, mIP[ ]: mIP processing, FA(u,v): an image value of the projected FA image at a position (u,v) corresponding to a projection line, and AveP[ ]: average projection processing.

More specifically, the ADC image and the FA image is subjected to mIP processing and average projection processing onto desired projection planes respectively along projection lines corresponding to all voxels in which a value of the mask function is 1. As a result, the projected ADC image and the projected FA image are generated.

Figure 5:
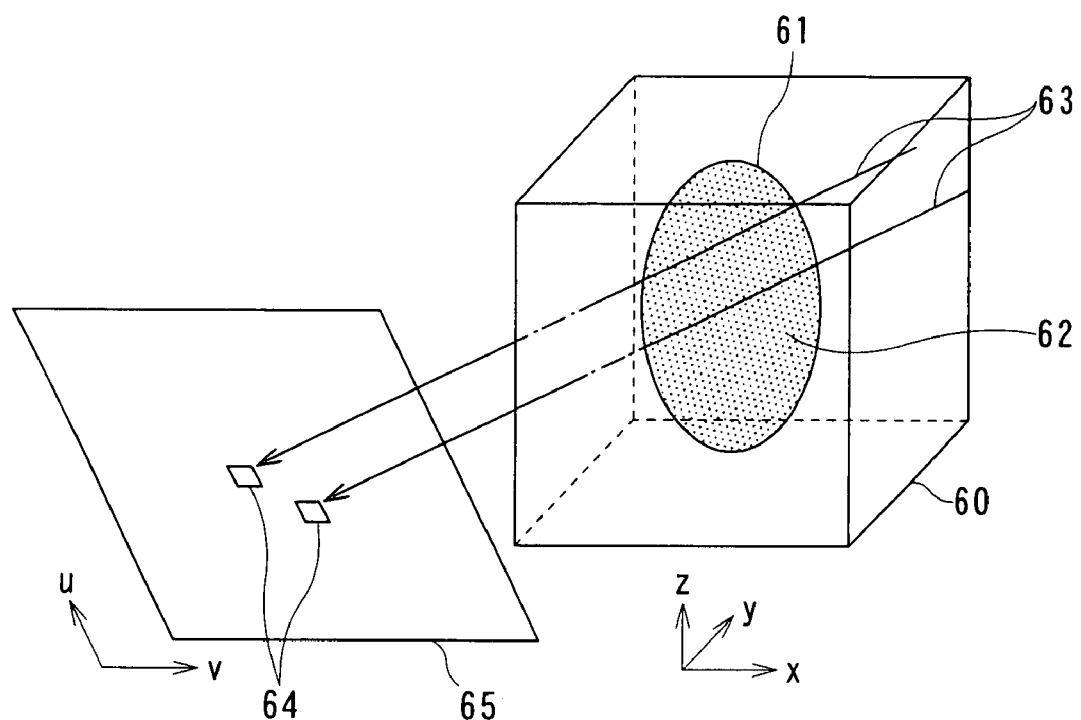
FIG. 5 is a diagram showing a relation between an ADC image and a projected ADC image generated by the image processing apparatus shown in FIG. 2.

FIG. 5 is a diagram showing a relation between an ADC image and a projected ADC image generated by the image processing apparatus 45 shown in FIG. 2. Note that, a relation between a FA image and a projected FA image is like as that between the ADC image and the projected ADC image.

As shown in FIG. 5, the ADC image 62 is generated as three-dimensional volume data on only positions (x,y,z) inside the mask area 61 in the three-dimensional space 60. Then, the ADC image 62 inside the mask area 61 is subjected to mIP processing in a designated projection direction 63. As a result, the two-dimensional projected ADC image 64 is generated on positions (u,v) on the projection plane 65.

When series of processing till above-mentioned mIP processing and average projection processing is represented as expressions with regarding the DWI volume data after normalization as original data, the series of processing can be represented like expression (10-1) and expression (10-2).

$$\mathrm{mIP}[\mathrm{ADC}[\mathrm{Mask}[S_{DWI}(x,y,z)]]] \quad (10\text{-}1)$$

$$\mathrm{AveP}[\mathrm{FA}[\mathrm{Mask}[S_{DWI}(x,y,z)]]] \quad (10\text{-}2)$$

Further, in the case of displaying an after-mentioned reference image, the second parameter image generating unit 50 stores correspondence information of data positions between the projected ADC image and the ADC image which is volume data and correspondence information of data positions between the projected FA image and the FA image which is volume data. The generated projected ADC image and the generated projected FA image are given to the display unit 34 from the second parameter image generating unit 50 to be displayed.

Consequently, a doctor can interpret the two-dimensional projection image of the DWI image, the ADC image and the FA image generated by two-dimensional projection processing. The information amount of the projected ADC image and the projected FA image is reduced since the projected ADC image and the projected FA image are generated selectively from only an area having possibility of a cancer. Therefore, a doctor can interpret the projected ADC image and the projected FA image with less labor. By this, not only oversight of a cancer is reduced to improve a diagnosis effect but also it is possible to assist accumulation of evidences on cancer diagnosis.

Further, a doctor can diagnose detail of a part which is considered as doubtful or relation between a doubtful part and a surrounding tissue on a two-dimensional projection image. In the case of like this, a doctor conventionally used to diagnose an image of a necessary part by searching DWI volume data which is original data or an ADC image. Accordingly, a doctor used to associate a two-dimensional projection image with DWI volume data or an ADC image with anatomy knowledge to get a necessary image with long time and large labor.

To the contrary, when a doctor gives display instruction of a reference image to the reference image generating unit 51 of the image processing apparatus 45 from the input device 33, a desired reference image on which an area having possibility of a cancer or an area and a position corresponding to a marking position on a two-dimensional projection image by the input device 33 such as a mouse is displayed distinctly is displayed on the display unit 34 automatically.

The reference image generating unit 51 acquires position information of marking on the projected ADC image, the projected FA image and the projected DWI image. Then, on the DWI volume data, the reference image generating unit 51 detects respective positions corresponding to marking on the projected ADC image, the projected FA image and the projected DWI image. This detection can be conducted easily by the reference image generating unit 51 acquiring the correspondence information of position coordinates between a two-dimensional projection image and three-dimensional volume data. The correspondence information has been stored in the first parameter image generating unit 47 or the second parameter image generating unit 50 at generating the projected ADC image, the projected FA image and the projected DWI image. That is, the reference image generating unit 51 performs marking on volume data serving as original data for a projection image through a projection image such as a projected ADC image, a projected FA image and a projected DWI image.

Then, for example, the reference image generating unit 51 generates an MPR (Multiple Planer Reformat) image which is a cross section conversion image as a reference image based on three-dimensional volume data such as T2W volume data, DWI volume data, ADC image volume data. In addition, the reference image generating unit 51 performs marking on a position, on the generated MPR image, corresponding to the marking position on the projection image. Then, the reference image on which marking is performed is given to the display unit 34 from the reference image generating unit 51 to be displayed.

As a reference image, not only MR image data such as T2W data, DWI data, two-dimensional data, three-dimensional data but data acquired by another image diagnostic apparatus such as CT image data may be used. Particularly, it is advantageous for diagnosis that T2W data such as slice T2W data and/or DWI data used for calculation of ADC image data are used for reference images. Further, marking can be performed to any images each used for a reference image.

Figure 6:
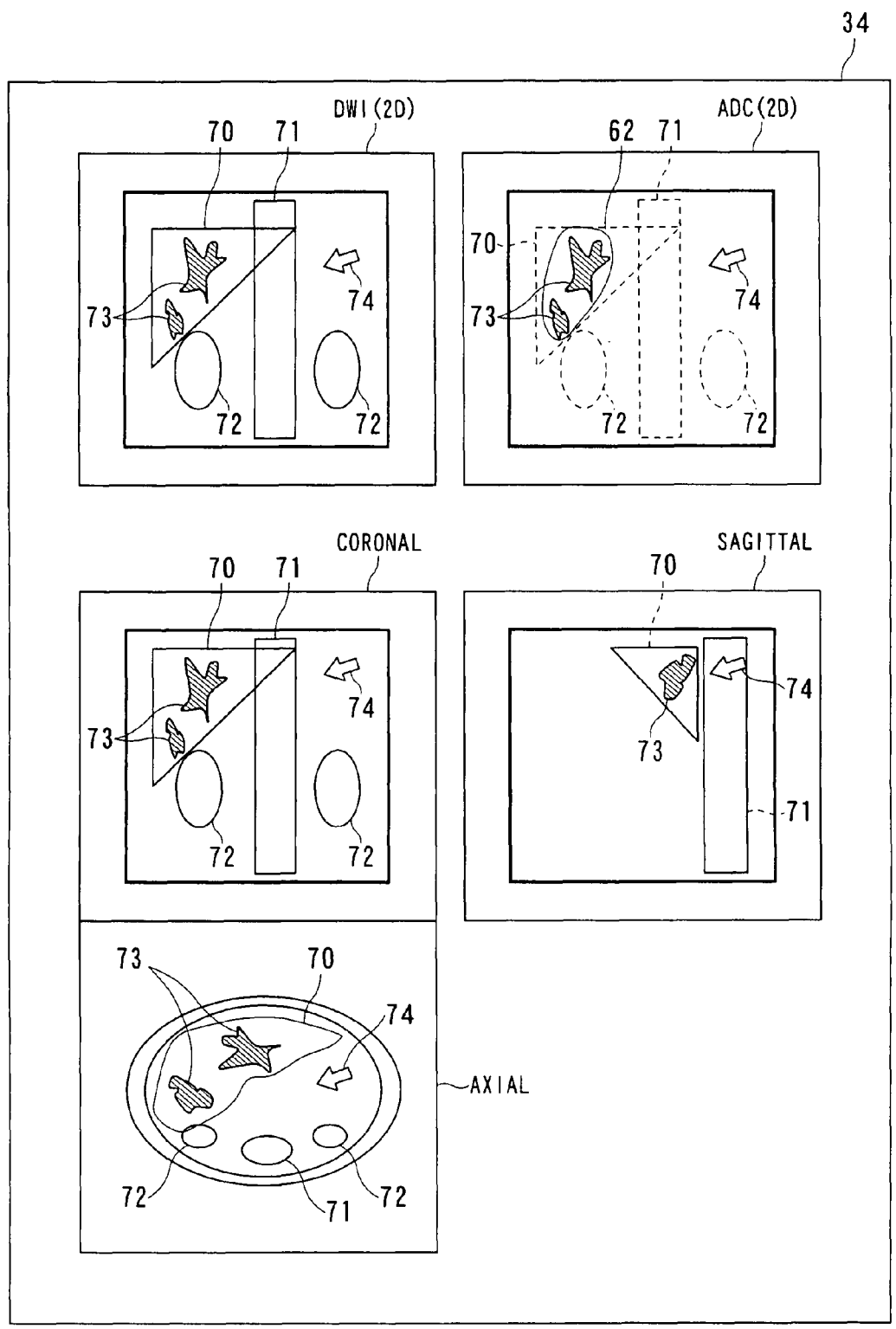
FIG. 6 is a diagram showing an example case of displaying images generated by the image processing apparatus shown in FIG. 2 on the display unit.

FIG. 6 is a diagram showing an example case of displaying images generated by the image processing apparatus 45 shown in FIG. 2 on the display unit 34. Note that, display of a projected FA image is omitted in FIG. 6.

As shown in FIG. 5, on the display unit 34, for example, in addition to a projected DWI image and a projected ADC image, three kind of MPR images of a coronal image, a sagittal image and an axial image are aligned and displayed. Note that, though the projected ADC image is an image of only a mask area 62, outline images of organs as shown by dotted lines are generated to be overlaid and displayed on the projected ADC image under image processing by the reference image generating unit 51. On each of the projected DWI image, the projected ADC image, the coronal image, the sagittal image and the axial image, a liver 70, a backbone 71, a kidney 72 are drawn.

As just described, information regarding to organs such as outlines of organs and/or MPR images can be obtained from T2W data and image data acquired through imaging different from diffusion weighted imaging by the reference image generating unit 51. The information regarding to organs may be combined with a projected ADC image and a projected FA image in a mask region 62 to be displayed on the display unit 34.

When a doctor diagnoses these images and adds marking 73 to a part determined as doubtful on either of the projected DWI image and the projected ADC image by operation of the input device 33 such as a mouse, marking 73 is also displayed on each corresponding position on other projection images and MPR images. Examples of marking method includes fusion displaying to overlap an image showing a marking 73, which is colored to be translucent, with an MPR image for displaying, a method for overlapping an image showing an outline of doubtful part, which is colored, with an MPR image as a monochrome image for displaying.

Further, in a case where a doctor moves a pointer 74 on a certain image with using the input device 33 such as a mouse, corresponding pointers 74 can be work with the moved pointer 74 on other images. In this case, the reference image generating unit 51 acquires manipulation information from the input device 33 and display a pointer 74 on each image based on correspondence information of position coordinates between a two-dimensional projected image and three-dimensional volume data. When pointers 74 in addition to the marking 73 are configured to work with each other between images as described above, it is possible for a doctor to identify positional relation between images obviously.

Accordingly, a doctor can check a position of a part which is considered as doubtful on an MPR image without associating positions between a two-dimensional projected image and volume data based on anatomy knowledge. In other words, a conventional operation of a doctor for identifying positional relation between different types of images can be automatized.

Further, a reference image such as an MPR image may be generated every time an instruction for generating a reference image is given to the reference image generating unit 51 from the input device 33. Alternatively, a desired reference image may be automatically displayed with a projected image by appointing a reference image to be displayed in advance. More specifically, if only a parameter such as a threshold for mask generation is set, reference images including a projected DWI image, a projected ADC image, a projected FA image and an MPR image can be automatically generated and displayed at the same time.

In addition, all or some of data acquisition, image reconstruction processing, image processing and image displaying may be automatized after setting an imaging condition. For example, when an imaging protocol for DWI setting a gradient magnetic field factor b>0 or an imaging protocol for T2W setting a gradient magnetic field factor b=0 is selected, an ADC image and/or a FA image may be automatically displayed on the display unit 34. A reference image may be also automatically displayed together with an ADC image and/or a FA image on the display unit 34 as shown in FIG. 6.

As regard to a reference image, for example, a doctor may direct generation of a MPR image on a necessary position for referring marked volume data to the reference image generating unit 51 by manipulation of the input device 33. On the other hand, a slice image of a mask area detected as a doubtful part in advance, or a slice image including an area nearby the mask area as margin may be displayed automatically with marking. Since a reference image generated automatically like this is outputted as a static image, the reference image is easy to be transmitted through a network.

1.—3 Effect

The magnetic resonance imaging apparatus 20 described above performs primary detection on volume data serving as original data and secondary image processing only to a screened part to generate a two-dimensional projected image as a quantitative image indicated with an objective different parameter. More specifically, the magnetic resonance imaging apparatus 20 generates a three-dimensional mask to select a necessary voxel on DWI volume data directly and spatially, calculates an ADC image and a projected FA image each serving as a quantitative image with regard to only voxels included in a mask area which is a spatial area selected by the three-dimensional mask and displays the calculated ADC image and the calculated projected FA image as two-dimensional projected images.

Accordingly, on diagnosis under diffusion imaging, it is possible to supply not only a qualitative DWI but an ADC image and a projected FA image which are quantitative images as information showing maximum effectiveness and having less data amount.

Consequently, especially in the case of acquiring a large amount of volume data such as a diagnosis screening cancer, it is possible for a doctor which is to be a user side to diagnose less information efficiently with a high accuracy since a part which should be interpreted becomes less. Accordingly, it is possible to not only reduce labor on doctor's diagnosis but improve diagnosis effectiveness by reducing oversight of an affected area. In addition, it is possible to assist accumulation of evidence on various diagnoses including cancer diagnosis.

Especially in the case of using diffusion imaging for screening cancer, with regard to a normal tissue showing a low signal intensity on a DWI, an ADC image which is a different parameter image conventionally used to be generated and displayed. However, the ADC image of a normal tissue is useless for interpretation. Further, in the case of performing two-dimensional projection of an ADC image, since a normal tissue shows a high pixel value, a cancer part is not drawn finely by merely performing two-dimensional projection to the ADC image directly so that a clinical meaningful image may not be acquired.

On the contrary, on the above-mentioned magnetic resonance imaging apparatus 20, a normal part in which an ADC is large and air part are masked on a DWI and after that, two-dimensional projection is performed. Therefore, selectivity of part to be interpreted becomes satisfactory so that it is possible to display a projected ADC image with high image quality compared to the case of masking on an ADC image. In the same way, it is also possible to display a projected FA image with high image quality compared to the case of masking on an FA image. Further, since a projected ADC image and a projected FA image can be generated as quantitative images, contribution to cancer progress degree staging and description diagnosis can be expected.

On the other hand, for apparatus side, since only DWI of a necessary part is selected for calculation of an ADC image and a FA image which are quantitative images, it is possible to reduce data size of image processing target. Consequently, speeding up of processing is realized so that it is possible to improve generation processing capacity of quantitative images including an ADC image and a FA image. In addition, it is possible to compress quantity of data stored in a data base. Further, since generation of a projected ADC image and a projected FA image can be performed automatically and size of data to be dealt with can be compressed, contribute to realization of CAD (computer aided diagnosis) is expected.

2. Second Embodiment

2.-1 Constitution and Function

Figure 7:
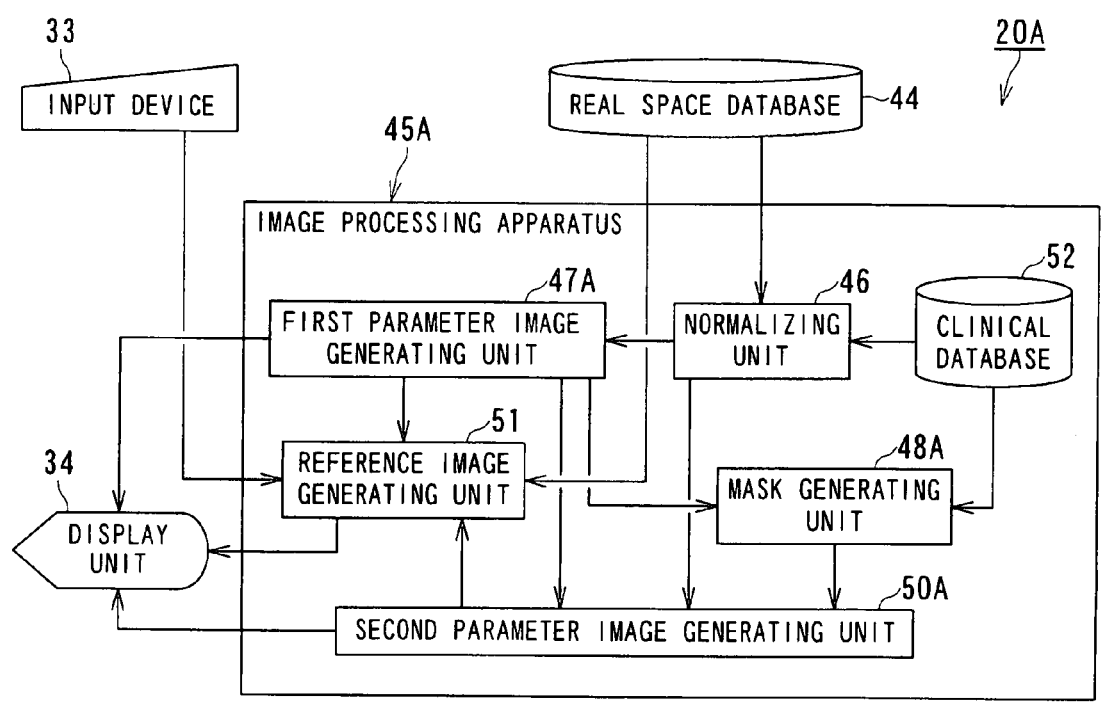
FIG. 7 is a functional block diagram of an image processing apparatus included in a magnetic resonance imaging apparatus according to a second embodiment of the present invention.

FIG. 7 is a functional block diagram of an image processing apparatus included in a magnetic resonance imaging apparatus according to a second embodiment of the present invention.

A magnetic resonance imaging apparatus 20A is different from the magnetic resonance imaging apparatus 20 shown in FIG. 1 in detail functions of an image processing apparatus 45A formed in the computer 32. Other structures and operations are substantially the same as in the magnetic resonance imaging apparatus 20 shown in FIG. 1. Therefore, only a functional block diagram of the image processing apparatus 45A is shown and the same reference numerals are used for similar components as in FIG. 2 with omitting description of equivalent functions.

The image processing apparatus 45A includes a normalizing unit 46, a first parameter image generating unit 47A, a mask generating unit 48A, a second parameter image generating unit 50A, a reference image generating unit 51 and a clinical database 52.

The first parameter image generating unit 47A of the image processing apparatus 45A has a function of generating a projected DWI image by performing MIP processing on the normalized DWI volume data that is received from the normalizing unit 46 and a function of storing correspondence information between positions of data on the projected DWI image and positions in the DWI volume data.

The mask generating unit 48A has a function of obtaining the projected DWI image generated by the first parameter image generating unit 47A and generating a two-dimensional mask on the projected DWI image using threshold values preset for image values of the projected DWI image and a function of supplying the generated mask and the projected DWI image to the second parameter image generating unit 50A.

The second parameter image generating unit 50A has a function of performing mask processing to the projected DWI image received from the mask generating unit 48A using the mask received from the mask generating unit 48A, a function of obtaining, from the first parameter image generating unit 47A, positional information of voxels of the normalized DWI volume data corresponding to data on the projected DWI image after mask processing, a function of obtaining, from the normalizing unit 46, the normalized T2W volume data and the normalized DWI volume data on the positions obtained from the first parameter image generating unit 47A, and a function of generating a projected ADC image and a projected FA image by calculating ADC values and FA values from the normalized T2W volume data and the normalized DWI volume data obtained from the normalizing unit 46. The projected ADC image and the projected FA image which are generated can be displayed on the display unit 34.

2.-2 Operation and Action

Next, the operation and action of the magnetic resonance imaging apparatus 20A will be described.

First, T2W volume data and DWI volume data of an object P are acquired by performing a scan. The acquired T2W volume data and DWI volume data are stored in the real space database 44 and supplied for image processing in the image processing apparatus 45A.

Figure 8:
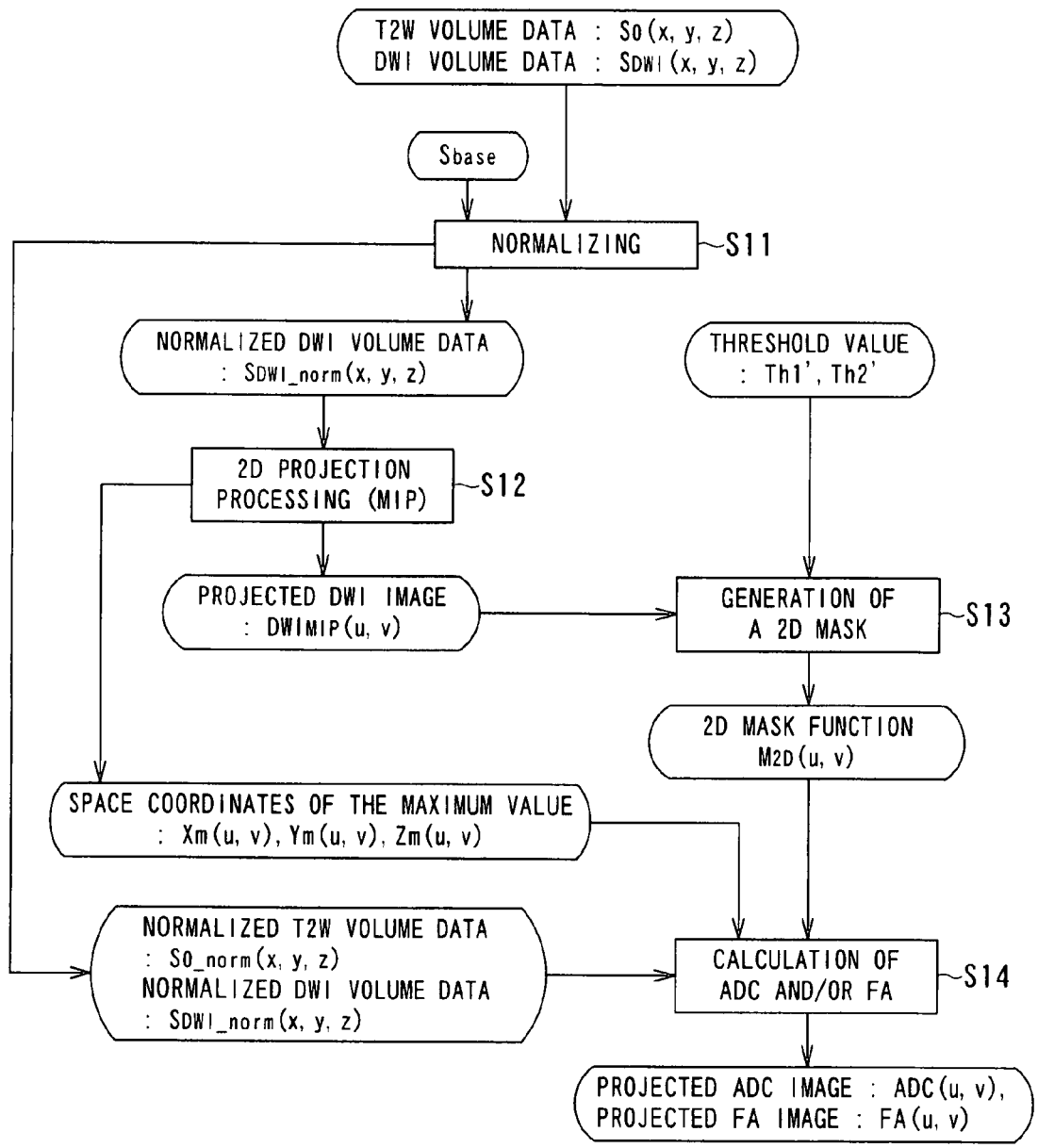
FIG. 8 is a flowchart showing a flow of image processing in the image processing apparatus shown in FIG. 7.

FIG. 8 is a flowchart showing a flow of image processing in the image processing apparatus 45A shown in FIG. 7. The symbols each including S with a number in FIG. 7 indicate steps of the flowchart.

In step S11, the normalizing unit 46 normalizes T2W volume data and DWI volume data.

Then, in step S12, the first parameter image generating unit 47A generates a projected DWI image from the normalized DWI volume data by MIP processing. Moreover, when the first parameter image generating unit 47A generates the projected DWI image, the first parameter image generating unit 47A stores the spatial coordinates of the DWI volume data showing the maximum image value on each projection line in association with a corresponding position on the projected DWI image.

An algorithm for generating a projected DWI image and retaining the spatial coordinates of DWI volume data showing the maximum image value on each projection line is given by, for example, expression (11).

$$\begin{aligned}&\text{Do for all voxels }(x,y,z)\\&\quad S_{DWI\_norm}(u,v)=\text{MIP}[S_{DWI\_norm}(x,y,z)]\\&\quad Xm(u,v)=xm,\ Ym(u,v)=ym,\ Zm(u,v)=zm\\&\text{end}\end{aligned} \quad (11)$$

wherein $S_{DWI\_norm}(u,v)$: an image value of a projected DWI image at a position (u,v) on the projection plane xm, ym, zm: spatial coordinates corresponding to the maximum value of the DWI volume data after normalization on a projection line, and Xm(u,v), Ym(u,v), Zm(u,v): spatial coordinates of data in the DWI volume data after normalization which serves as data of the projected DWI image at a position (u,v) on the projection plane.

As shown in expression (11), since MIP processing is performed in an arbitrary direction, the maximum value of normalized DWI volume data on each projection line is a function of a position (u, v) after projection on the projection plane of the projected DWI image. Then, the projected DWI image generated by the first parameter image generating unit 47A is supplied to the mask generating unit 48A, and the retained spatial coordinates in the normalized DWI volume data corresponding to data on the projected DWI image are supplied to the second parameter image generating unit 50A.

Then, in step S13, the mask generating unit 48A generates a two-dimensional mask for determining an area, for which a projected ADC image and a projected FA image are calculated, on the projected DWI image. That is to say, the mask generating unit 48A generates a mask function by comparing the projected DWI image with predetermined threshold values. An algorithm for generating a mask function is given by, for example, expression (12).

$$\begin{aligned}&\text{Do for all pixels } (u,v)\\&\quad \text{if Th1}' < S_{DWI\_norm}(u,v) < \text{Th2}'\\&\quad\quad M_{2D}(u,v)=1\\&\quad \text{else}\\&\quad\quad M_{2D}(u,v)=0\\&\text{end}\end{aligned} \quad (12)$$

wherein

Th1': a threshold for lower limit of a signal intensity of the projected DWI image, Th2': a threshold for upper limit of a signal intensity of the projected DWI image, and $M_{2D}(u,v)$ a two-dimensional mask function.

That is to say, all pixels in positions (u, v) on the projected DWI image having been subjected to MIP processing are subjected to determination for generating a mask function using the threshold values. All pixels in positions (u, v) on the projected DWI image can be said to be all voxels in positions (xm, ym, zm), in each of which the maximum value is reached on a corresponding projection line in the normalized DWI volume data.

It is determined whether a signal intensity $S_{DWI\_norm}(u,v)$ of the projected DWI image in a position (u, v) falls between a threshold Th1' for a lower limit and a threshold Th2' for an upper limit preset for signal intensities of the projected DWI image. When a signal intensity $S_{DWI\_norm}(u, v)$ of the projected DWI image falls between the threshold Th1' for the lower limit and the threshold Th2' for the upper limit, the value of the mask function $M_{2D}(u, v)$ in the corresponding position (u, v) is set to one. Otherwise, the values of the mask function $M_{2D}(u, v)$ in the other positions (u, v) are set to zero. That is to say, the mask function is generated such that the value of the mask function is one in a two-dimensional area that is considered to be a potential cancer part, for which a projected ADC image and a projected FA image are calculated, on the projected DWI image, and the value of the mask function is zero in the other two-dimensional area.

The threshold Th1' for the lower limit and the threshold Th2' for the upper limit for signal intensities of the projected DWI image may be determined by a method similar to that for determining the threshold Th1 for the lower limit and the threshold Th2 for the upper limit for signal intensities of the normalized DWI volume data, as shown in the algorithm of expression (5). For example, the threshold Th1' for the lower limit and the threshold Th2' for the upper limit for signal intensities of the projected DWI image may be determined by multiplying the maximum signal intensity of the projected DWI image by a constant ratio, as in expressions (6-1) and (6-2).

Then, the mask generating unit 48A supplies the generated mask function and the projected DWI image to the second parameter image generating unit 50A.

Then, in step S14, the second parameter image generating unit 50A calculates an ADC image and an FA image using volume data in positions corresponding to data of the two-dimensional area extracted by masking processing to the projected DWI image. Masking processing to a projected DWI image can be mathematically described by expression (13).

$$\text{Mask}[\text{MIP}[S_{DWI\_norm}(x,y,z)]] \quad (13)$$

An algorithm for masking processing to a projected DWI image and calculating an ADC image and a projected FA image is given by, for example, expression (14).

$$\begin{aligned}&\text{Do for all voxels corresponding } M_{2D}(u,v)=1\\&\quad \text{ADC}(u,v)=\text{ADC}(Xm(u,v),Ym(u,v),Zm(u,v))\\&\quad =\ln[\{S_0(Xm(u,v),Ym(u,v),Zm(u,v))\}/\\&\quad\quad \{S_{DWI\_norm}(Xm(u,v),Ym(u,v),Zm(u,v))\}]/(b_n-b_0)\\&\quad \text{FA}(u,v)=\text{FA}(Xm(u,v),Ym(u,v),Zm(u,v))\\&\quad =\text{sqrt}(1.5)\cdot\text{sqrt}[(\lambda_1-D_m)^2+(\lambda_2-D_m)^2+(\lambda_3-D_m)^2]/\text{sqrt}(\lambda_1^2+\lambda_2^2+\lambda_3^2)\\&\text{end}\end{aligned} \quad (14)$$

wherein

ADC(u,v): a value of ADC at a position (u,v) on the projection plane, and

FA(u,v): a value of FA at a position (u,v) on the projection plane.

Note that, the definitions of a mean diffusivity Dm and $\lambda_1$, $\lambda_2$, $\lambda_3$ are the same as those of the expression (8). Each of the mean diffusivity Dm and $\lambda_1$, $\lambda_2$, $\lambda_3$ is a function of (Xm(u,v), Ym(u,v), Zm(u,v)).

That is to say, the second parameter image generating unit 50A extracts a two-dimensional area (u, v), in which the value of the mask function $M_{2D}(u, v)$ obtained from the mask generating unit 48A is one, on the projected DWI image $S_{DWI\_norm}(u, v)$ by mask processing. Then, spatial coordinates (Xm(u, v), Ym(u, v), Zm(u, v)) of voxels in the normalized DWI volume data $S_{DWI\_norm}(x, y, z)$ corresponding to data of the extracted two-dimensional area (u, v) on the projected DWI image $S_{DWI\_norm}(u, v)$ are obtained from the first parameter image generating unit 47A. Moreover, the normalized T2W volume data $S_0(Xm(u, v), Ym(u, v), Zm(u, v))$ and the normalized DWI volume data $S_{DWI\_norm}(Xm(u, v), Ym(u, v), Zm(u, v))$ at the obtained spatial coordinates (Xm (u, v), Ym(u, v), Zm(u, v)) are obtained from the normalizing unit 46.

Then, the second parameter image generating unit 50A calculates an ADC(u, v) in a position (u, v) on the projection plane using the normalized T2W volume data $S_0(Xm(u, v), Ym(u, v), Zm(u, v))$ and at least six sets (three sets in a case where an FA(u, v) need not be calculated) of the normalized DWI volume data $S_{DWI\_norm}(Xm(u, v), Ym(u, v), Zm(u, v))$ obtained from the normalizing unit 46. Then, an FA(u, v) is calculated from $\lambda_1$, $\lambda_2$, and $\lambda_3$.

Figure 9:
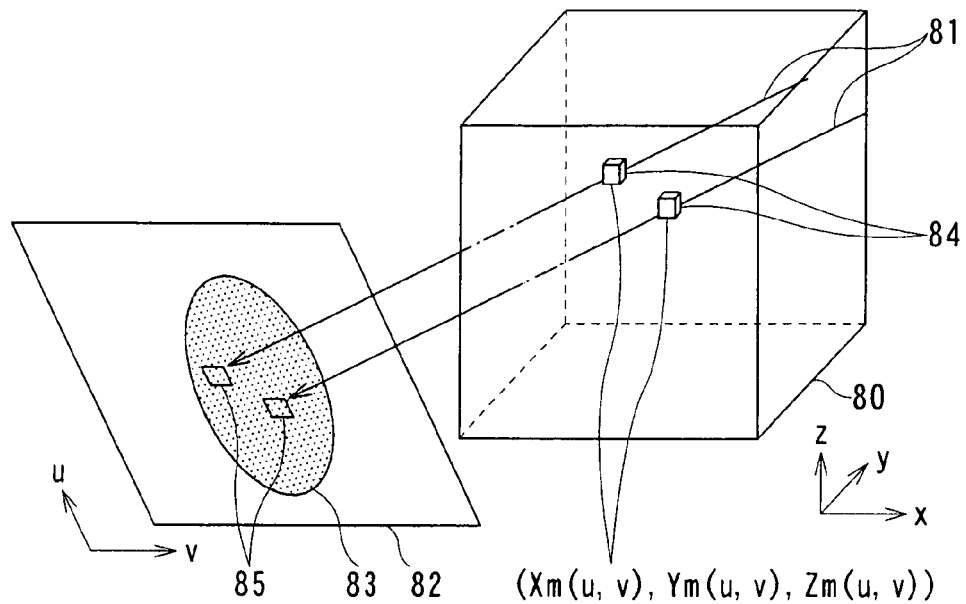
FIG. 9 is a diagram showing a relation between an ADC image and a projected ADC image generated by the image processing apparatus shown in FIG. 7.

FIG. 9 is a diagram showing a relation between an ADC image and a projected ADC image generated by the image processing apparatus 45 shown in FIG. 7. Note that, a relation between a FA image and a projected FA image is like as that between the ADC image and the projected ADC image.

A projected DWI image is generated in positions (u, v) on a projection plane 82 from DWI volume data 80 of three dimensions (x, y, z) by performing MIP processing in a projection direction 81, as shown in FIG. 9. Then, a masked area 83 is generated on the projected DWI image by mask processing, and spatial coordinates (Xm(u, v), Ym(u, v), Zm(u, v)) in the DWI volume data projected as data in the positions (u, v) in the masked area 83 are obtained. Then, an ADC(Xm (u, v), Ym(u, v), Zm(u, v)) 84 is calculated as three-dimensional volume data using the DWI volume data $S_{DWI\_norm}$ (Xm(u, v), Ym(u, v), Zm(u, v)) at the spatial coordinates (Xm(u, v), Ym(u, v), Zm(u, v)). Moreover, a two-dimensional projected ADC image ADC(u, v) 85 is generated by projecting the ADC(Xm(u, v), Ym(u, v), Zm(u, v)) 84, which is three-dimensional volume data, on the projection plane 82. The process of projecting ADC volume data is not expressed as mathematical operations actually, as shown in the algorithm of expression (14).

The aforementioned series of processing to generate a projected ADC image and a projected FA image is mathematically described by expressions (15-1) and (15-2).

$$ADC[Mask[MIP[S_{DWI}(x,y,z)]]] \tag{15-1}$$

$$FA[Mask[MIP[S_{DWI}(x,y,z)]]] \tag{15-2}$$

Note that, processing of obtaining spatial coordinates is also included in ADC processing in expression (15-1). The same applies to FA processing in expression (15-2).

Then, the projected ADC image and the projected FA image obtained in this way are output from the second parameter image generating unit 50A to the display unit 34. Moreover, a reference image such as an MPR image is generated by the reference image generating unit 51 and displayed on the display unit 34, if required.

That is to say, the image processing apparatus 45A in the magnetic resonance imaging apparatus 20A generates a two-dimensional mask for extracting an area that is considered to be a potential cancer part on a projected DWI image, and generates a projected ADC image and a projected FA image from three-dimensional DWI volume data corresponding to pixels of an area of the projected DWI image extracted by mask processing. For this purpose, in the image processing apparatus 45A, when MIP processing is performed on the DWI volume data, positions of pixels on the projected DWI image are stored in association with spatial coordinates of voxels in each of which the maximum value of the three-dimensional DWI volume data is reached on a corresponding projection line. Thus, a projected ADC image can be generated by masking DWI volume data substantially using a two-dimensional mask and generating ADC volume data from the masked DWI volume data to be projected. In this case, projection of ADC volume data corresponds to a process of setting the ADC value of each voxel, in which the maximum value is reached on a corresponding projection line in three-dimensional DWI volume data, as a value of the projected ADC image in a corresponding pixel on the projected DWI image in calculation. The same applies to a projected FA image.

Thus, in the magnetic resonance imaging apparatus 20A, advantageous effects similar to those of a magnetic resonance imaging apparatus 20 shown in FIG. 1 can be achieved. In addition, since a mask is set for a projected two-dimensional DWI, an area subjected to determination using threshold values can be expected to be narrowed down. Moreover, since only data having the maximum value on each projection line is extracted from DWI volume data and used to calculate an ADC image and an FA image, the amount of compression of information can be increased, and the capacity and accuracy of extraction of data which is clinically meaningful can be improved. Thus, the efficiency and accuracy of diagnosis and the processing speed can be improved.

Note that, when a two-dimensional mask function $M_{2d}(u, v)$ generated via a projected DWI image is expressed as a function $M_{3D}(x, y, z)$ of spatial coordinates of a voxel (xm, ym, zm) corresponding to a pixel of the projected DWI image, a three-dimensional mask function can be obtained.

3. Other Embodiments

In the aforementioned embodiment, an example is described, in which a projected DWI image, a projected ADC image, and a projected FA image are generated from DWI volume data serving as source data. However, even when a plurality of different arbitrary projected images other than these types of data are generated from predetermined volume data, only an area which is meaningful for diagnosis may be extracted by mask processing, and the projected images may be generated only for the extracted area. Moreover, only one of a projected ADC image and a projected FA image may be generated.

Moreover, sets of data subjected to projection need not be in a relationship in which one of the sets of data is generated from the other one of the sets of data by calculation, such as the relationship between DWI and an ADC image. For example, sets of data separately collected, such as a T1 weighted image (T1W), a T2W, a DWI, and a perfusion weighted image (PWI), or a quantitative value, such as a calculated T1, T2, and a proton density, may be subjected to projection. In particular, when the effect in a case where a region of interest is extracted on one set of data is large compared with that in a case where the region of interest is extracted on the other set of data, the method according to each aforementioned embodiment is an effective method for generating a mask. For example, an image for diagnosis obtained when a region of interest is extracted on a DWI may be meaningful compared with that obtained when the region of interest is extracted on an ADC image. In this case, the method according to each aforementioned embodiment is an effective method for generating a mask.

Moreover, an image generated for diagnosis is not limited to a projected image, such as an MIP image, an mIP image, or an average projected image, and may be any image. For example, an image generated for diagnosis may be an MPR image or a volume rendering (VR) image.

Accordingly, the aforementioned image processing apparatuses 45 and 45A can process an image acquired by not only the magnetic resonance imaging apparatuses 20 and 20A but also a desired image diagnostic apparatus, for example, an X-ray computed tomography (CT) apparatus or a positron emission computed tomography (PET)-CT apparatus. The image processing apparatuses 45 and 45A can be applied to a case where a plurality of mutually different parameter images are generated from data of arbitrary dimensions including volume data serving as source data.

The image processing apparatuses 45 and 45A may not be built in an image diagnostic apparatus and may be connected to an image diagnostic apparatus via networks.

Figure 10:
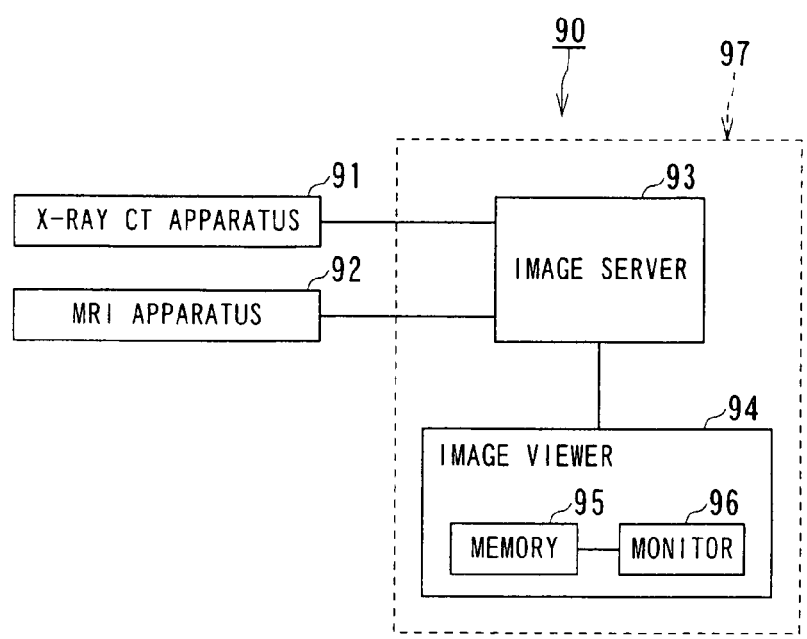
FIG. 10 is a block diagram of an image diagnostic system using an image processing apparatus according to the present invention.
Figure 11:
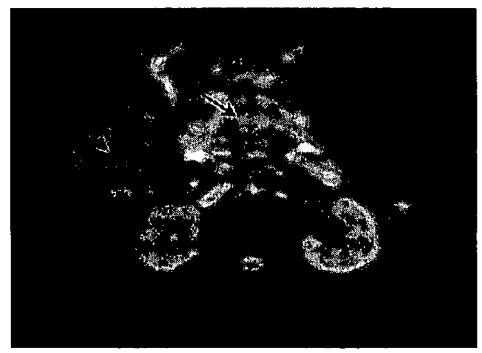
FIG. 11 is a T2W showing pancreatic cancer and liver metastasis which is a clinical example of trunk diffusion obtained by conventional magnetic resonance imaging.
Figure 12:
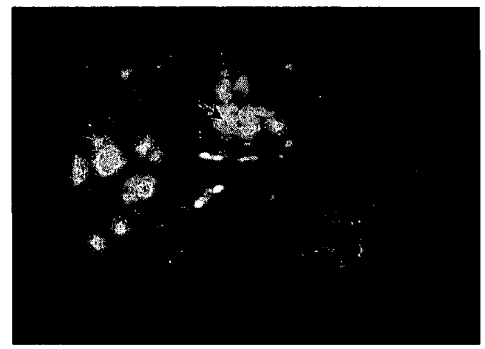
FIG. 12 is a DWI of the pancreatic cancer and liver metastasis shown in FIG. 11 obtained by conventional magnetic resonance imaging.
Figure 13:
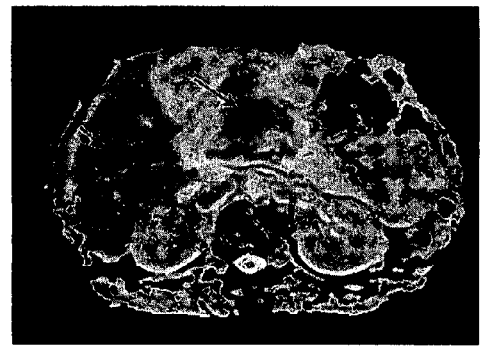
FIG. 13 is an ADC image of the pancreatic cancer and liver metastasis shown in FIG. 11 obtained by conventional magnetic resonance imaging.
Figure 14:
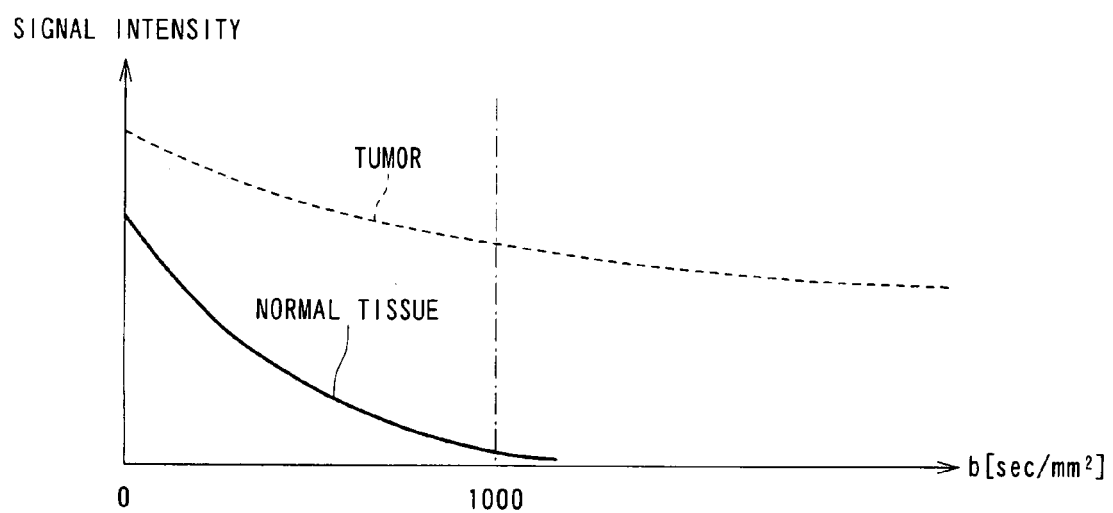
FIG. 14 is a graph showing variations of respective signal intensities in a normal tissue and tumor each depending on a value of a gradient magnetic field factor b in a diffusion imaging.

FIG. 10 is a block diagram of an image diagnostic system using an image processing apparatus according to the present invention.

An image diagnostic system 90 is configured by image diagnostic apparatuses such as an X-ray CT apparatus 91 and an MRI apparatus 92 and an image sever 93 connected with the image diagnostic apparatuses via a network. The image sever 93 is connected with an image viewer 94. The image viewer 94 includes a memory 95 and a monitor 96.

The image server 93 has a function of obtaining, via networks, diagnostic image data acquired by image diagnostic apparatuses, such as an X-ray CT apparatus 91 and an MRI apparatus 92, and storing the obtained diagnostic image data. Moreover, the image server 93 can store a desired image processing program and perform various types of image processing on diagnostic image data.

The image viewer 94 has a function of obtaining desired diagnostic image data from the image server 93 and displaying the diagnostic image data on the monitor 96. The image viewer 94 may include the memory 95 and store diagnostic image data in the memory 95, if required. When an image processing program is stored in the memory 95, the image viewer 94 can perform image processing on diagnostic image data obtained from the image server 93.

When a program or a necessary circuit for implementing the functions of the image processing apparatuses 45 and 45A described above are stored or provided in the image server 93 in the imaging diagnostic system 90 having the aforementioned structure, the image processing apparatus 97 can be formed of the image server 93 and the image viewer 94. Moreover, when a program for implementing the functions of the image processing apparatuses 45 and 45A described above is stored in the memory 95 in the image viewer 94, the image viewer 94 gets the functions of the image processing apparatuses 45 and 45A.

What is claimed is:

1. An image processing apparatus comprising:
   a storage unit configured to store diffusion weighted image data;
   a specifying unit configured to specify a calculation target region encompassing only a subset of the diffusion weighted image data;
   a calculation unit configured to calculate at least one of diffusion coefficient and fractional anisotropy data serving as an index of diffusion anisotropy within the calculation target region based on the diffusion weighted image data; and
   a display unit configured to display at least one of the diffusion coefficient and the fractional anisotropy data calculated by said calculation unit.

2. An image processing apparatus according to claim 1, wherein said calculation unit is configured to perform projection processing with regard to the calculation target region, and
   said display unit is configured to display an image subjected to the projection processing as either of an apparent diffusion coefficient image and a fractional anisotropy image.

3. An image processing apparatus according to claim 1, wherein said specifying unit is configured to specify a range of either of pieces of diffusion weighted image data and diffusion weighted volume data beyond a threshold as the calculation target region.

4. An image processing apparatus according to claim 1, wherein said specifying unit is configured to specify a range beyond a threshold of a projected image obtained by projection processing of diffusion weighted volume data as the calculation target region.

5. An image processing apparatus according to claim 1, wherein said specifying unit is configured to specify a region having possibility of cancer as the calculation target region.

6. An image processing apparatus according to claim 1, wherein said storage unit is configured to store plural types of diffusion weighted image data of which at least one of corresponding b values each meaning a gradient magnetic field factor and corresponding directions of applying diffusion gradient magnetic field pulses are mutually different, and
   said calculation unit is configured to calculate at least one of the diffusion coefficient and the fractional anisotropy data based on the plural types of diffusion weighted image data.

7. An image processing apparatus according to claim 1, wherein said calculation unit is configured to generate information regarding to an organ based on at least one of transverse relaxation time weighted image data of which corresponding b value meaning a gradient magnetic field factor is able to be assumed to be substantially zero and image data acquired by imaging different from diffusion weighted imaging, and
   said display unit is configured to combine the information regarding to the organ with at least one of the diffusion coefficient and the fractional anisotropy data for displaying.

8. An image processing apparatus according to claim 1, further comprising a designating unit for marking to one of a diffusion weighted image, an apparent diffusion coefficient image and a fractional anisotropy image,
   wherein said display unit is configured to display a first one of the diffusion weighted image, the apparent diffusion coefficient image and the fractional anisotropy image with the marking by said designating unit and a second one of said images with marking at a position corresponding to the marking in said first image.

9. An image processing apparatus according to claim 8, wherein said calculation unit is configured to generate a multiplanar reconstruction image based on at least one of transverse relaxation time weighted image data of which corresponding b value meaning a gradient magnetic field factor is assumed to be substantially zero and image data acquired by imaging different from diffusion weighted imaging, and
   said display unit is configured to display the multiplanar reconstruction image with marking at the position corresponding to the marking in said first image.

10. A magnetic resonance imaging apparatus comprising:
    a data acquisition unit configured to acquire diffusion weighted image data;
    a specifying unit configured to specify a calculation target region encompassing only a subset of the diffusion weighted image data;
    a calculation unit configured to calculate at least one of diffusion coefficient and a fractional anisotropy data serving as an index of diffusion anisotropy within the calculation target region based on the diffusion weighted image data; and
    a display unit configured to display at least one of the diffusion coefficient and the fractional anisotropy data calculated by said calculation unit.

11. An image processing method comprising steps of:
    specifying a calculation target region encompassing only a subset of diffusion weighted image data;

calculating at least one of diffusion coefficient and fractional anisotropy data serving as an index of diffusion anisotropy within the calculation target region based on the diffusion weighted image data; and displaying at least calculated one of the diffusion coefficient and the fractional anisotropy data.

* * * * *